United States Patent
Valaee et al.

(10) Patent No.: US 11,962,440 B2
(45) Date of Patent: Apr. 16, 2024

(54) DECISION FEEDBACK EQUALIZER FOR LOW-VOLTAGE HIGH-SPEED SERIAL LINKS

(71) Applicant: QUALCOMM Incorporated, San Diego, CA (US)

(72) Inventors: Darius Valaee, San Diego, CA (US); Patrick Isakanian, El Dorado Hills, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/550,993

(22) Filed: Dec. 14, 2021

(65) Prior Publication Data
US 2023/0188388 A1    Jun. 15, 2023

(51) Int. Cl.
*H04L 25/03* (2006.01)
*G11C 7/06* (2006.01)

(52) U.S. Cl.
CPC ........ *H04L 25/03267* (2013.01); *G11C 7/065* (2013.01); *H04L 25/03057* (2013.01)

(58) Field of Classification Search
CPC ............. G01R 19/0038; H03K 5/2418; H03K 5/2445; H03K 5/2481
USPC ........................................................ 327/65
See application file for complete search history.

(56) References Cited

U.S. PATENT DOCUMENTS

| | | | |
|---|---|---|---|
| 9,699,009 B1 | 7/2017 | Ainspan et al. | |
| 10,348,534 B1 * | 7/2019 | Sreeramaneni | ....... H04L 25/021 |
| 10,523,472 B1 | 12/2019 | Zhao et al. | |
| 11,164,623 B1 * | 11/2021 | Nakamura | .......... G11C 11/4094 |
| 11,183,982 B2 * | 11/2021 | Tajalli | .................. H03G 3/3089 |
| 2008/0089155 A1 * | 4/2008 | Bae | ....................... G11C 7/1078 365/205 |
| 2010/0020862 A1 | 1/2010 | Peng | |
| 2012/0274359 A1 | 11/2012 | Ding et al. | |
| 2017/0085403 A1 * | 3/2017 | Sun | ................... H04L 25/03146 |
| 2018/0343149 A1 | 11/2018 | Kim et al. | |

(Continued)

FOREIGN PATENT DOCUMENTS

CN        113556104 A      10/2021

OTHER PUBLICATIONS

Kim Y-J., et al., "A 16-Gb, 18-Gb/s/pin GDDR6 DRAM With Per-Bit Trainable Single-Ended DFE and PLL-Less Clocking", IEEE Journal Of Solid-State Circuits, vol. 54, No. 1, Jan. 2019, pp. 197-209.

(Continued)

*Primary Examiner* — Quan Tra
(74) *Attorney, Agent, or Firm* — Loza & Loza, LLP

(57) ABSTRACT

In certain aspects, a comparator includes an input stage and a regeneration stage. The input stage includes a first input circuit coupled to a first node and a second node, a first switching transistor configured to enable the first input circuit if a previous bit value is one, a second input circuit coupled to the first node and the second node, and a second switching transistor configured to enable the second input circuit if the previous bit value is zero. The regeneration stage includes a first inverter, a second inverter cross coupled with the first inverter, a first drive transistor coupled to the first inverter, wherein a gate of the first drive transistor is coupled to the second node, and a second drive transistor coupled to the second inverter, wherein a gate of the second drive transistor is coupled to the first node.

34 Claims, 13 Drawing Sheets

(56) References Cited

U.S. PATENT DOCUMENTS

| | | | |
|---|---|---|---|
| 2019/0312757 A1* | 10/2019 | Sakai | H03K 5/24 |
| 2020/0067499 A1* | 2/2020 | Takase | H03K 5/2481 |
| 2020/0116765 A1* | 4/2020 | Ahn | H03K 5/2418 |
| 2021/0184640 A1* | 6/2021 | Miura | H03F 3/45183 |
| 2021/0288846 A1 | 9/2021 | Yi et al. | |
| 2022/0077830 A1 | 3/2022 | Duan et al. | |
| 2023/0023730 A1 | 1/2023 | Lin | |
| 2023/0074266 A1* | 3/2023 | Gu | G11C 11/4076 |

OTHER PUBLICATIONS

Park M., et al., "A 7Gb/s 9.3mW 2-Tap Current-Integrating DFE Receiver", ISSCC 2007 / Session 12 / GIGABIT CDRs and Equalizers / 12.5, 2007 IEEE International Solid-State Circuits Conference, Feb. 13, 2007, 3 Pages.

Amaya A., et al., "A Digital Phase-Based on-fly Offset Compensation Method for Decision Feedback Equalisers", IET Circuits Devices and Systems, The Institution of Engineering and Technology, GB, vol. 15, No. 4, Mar. 21, 2021, pp. 297-309, XP006105687, 13 Pages, Figure 5.

Gu Y., et al., "A 2-stage with 3-Stack 1-Tap DFE Sense Amplifier Based on Dual Reference for High Speed & Low Power DRAM Interface", 2021 IEEE 14th International Conference on ASIC (ASICON), IEEE, Oct. 26, 2021, 4 Pages, XP034035556, Retrieved on Nov. 18, 2021, Section 3, Figures 4,5.

International Search Report and Written Opinion—PCT/US2022/051335—ISA/EPO—dated Apr. 5, 2023.

Milijevic S., et al., "4 Gbit/s Receiver with Adaptive Blind DFE", Electronics Letters, The Institution of Engineering and Technology, GB, vol. 41, No. 25, Dec. 8, 2005, XP006025663, pp. 1373-1374, 2 pages, figure 1.

\* cited by examiner

DECISION FEEDBACK EQUALIZER FOR LOW-VOLTAGE HIGH-SPEED SERIAL LINKS

BACKGROUND

Field

Aspects of the present disclosure relate generally to equalizers, and more particularly, to decision feedback equalizers.

Background

In a system, data may be transmitted from a transmitter to a receiver across a serial link. The data may be transmitted using symbols where each symbol carries a data bit. Because of non-idealities in the serial link (e.g., notches in the frequency response of the serial link due to reflection), the incoming symbols at the receiver are distorted. The distortion may cause the symbols to spread into one another, resulting in intersymbol interference (ISI) at the receiver. The receiver may employ decision feedback equalization to reduce the ISI.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a comparator. The comparator includes an input stage and a regeneration stage. The input stage includes a first input circuit coupled to a first node and a second node, a first switching transistor configured to enable the first input circuit if a previous bit value is one, a second input circuit coupled to the first node and the second node, and a second switching transistor configured to enable the second input circuit if the previous bit value is zero. The regeneration stage includes a first inverter, a second inverter cross coupled with the first inverter, a first drive transistor coupled to the first inverter, wherein a gate of the first drive transistor is coupled to the second node, and a second drive transistor coupled to the second inverter, wherein a gate of the second drive transistor is coupled to the first node.

A second aspect relates to a method of operating a comparator. The comparator includes an input stage and a regeneration stage. The regeneration stage includes a first inverter, a second inverter cross-coupled with the first inverter, a first drive transistor coupled to the first inverter, and a second drive transistor coupled to the second inverter, wherein a gate of the second drive transistor is coupled to a first node of the input stage, and a gate of the first drive transistor is coupled to a second node of the input stage. The method includes, if a previous bit value is one, comparing an input voltage with a first compare voltage, and generating a first voltage on the first node and a second voltage on the second node based on the comparison of the input voltage with the first compare voltage. The method also includes, if the previous bit value is zero, comparing the input voltage with a second compare voltage, and generating the first voltage on the first node and the second voltage on the second node based on the comparison of the input voltage with the second compare voltage.

A third aspect relates to a system. The system includes a comparator and a latch. The comparator includes an input stage and a regeneration stage. The input stage includes a first input circuit coupled to a first node and a second node, a first switching transistor configured to enable the first input circuit if a previous bit value is one, a second input circuit coupled to the first node and the second node, and a second switching transistor configured to enable the second input circuit if the previous bit value is zero. The regeneration stage includes a first inverter and a second inverter cross coupled with the first inverter, wherein a first output of the comparator is coupled to an output of the second inverter and a second output of the comparator is coupled to an output of the first inverter. The regeneration stage also includes a first drive transistor coupled to the first inverter, wherein a gate of the first drive transistor is coupled to the second node, and a second drive transistor coupled to the second inverter, wherein a gate of the second drive transistor is coupled to the first node. The latch has a first input and a second input, wherein the first input of the latch is coupled to the first output of the comparator, and the second input of the latch is coupled to the second output of the comparator.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
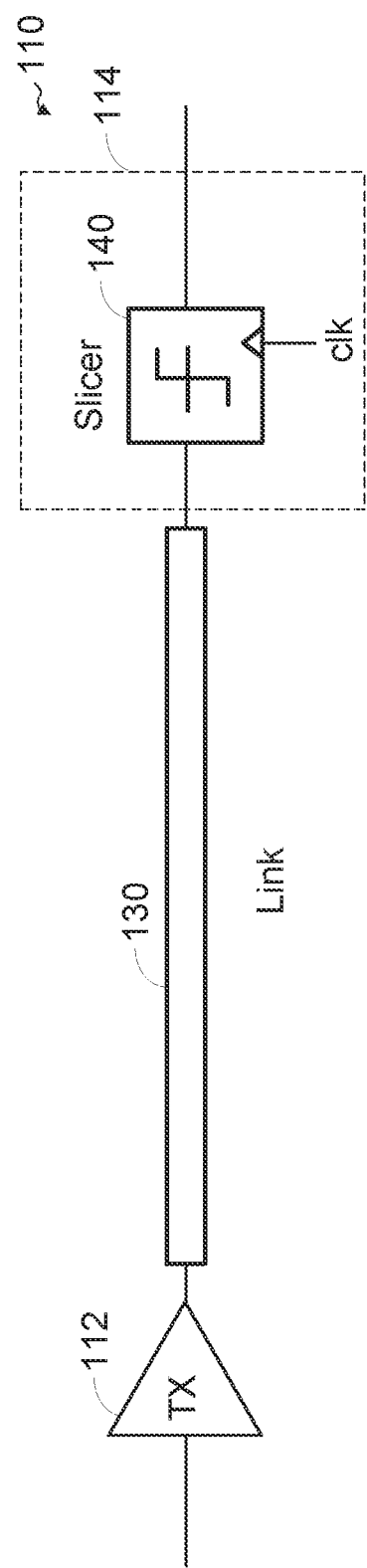
FIG. 1 shows an example of a system according to certain aspects of the present disclosure.

FIG. 1 shows an example of a system 110 in which data is transmitted from a transmitter 112 to a receiver 114 across a link 130 (e.g., a serial link). The transmitter 112 receives bits from a data source (not shown) and transmits the bits as a sequence of symbols across the link 130. At the receiver 114, a slicer 140 receives the symbols from the link 130 and converts the symbols into a sequence of bits (i.e., bit stream). The bit stream may be sent to a processor (not shown) or another circuit for further processing. It is to be appreciated that the receiver 114 may include one or more additional components not explicitly shown in FIG. 1. The system 110 may also include serializer/deserializer (SerDes), a double-data rate (DDR) dynamic random-access memory (DRAM), and/or another circuit, as discussed further below.

As discussed above, the transmitter 112 may transmit bits as symbols across the link 130. In certain aspects, each symbol carries one bit. Each symbol may be in the form of a pulse in which an amplitude (e.g., voltage) of the pulse represents the bit value (i.e., one or zero) of the respective bit. The slicer 140 receives a symbol and makes a bit decision based on the received symbol to obtain the respective bit. The bit decision may be made based on the voltage of the received symbol or another attribute of the received symbol.

Figure 2:
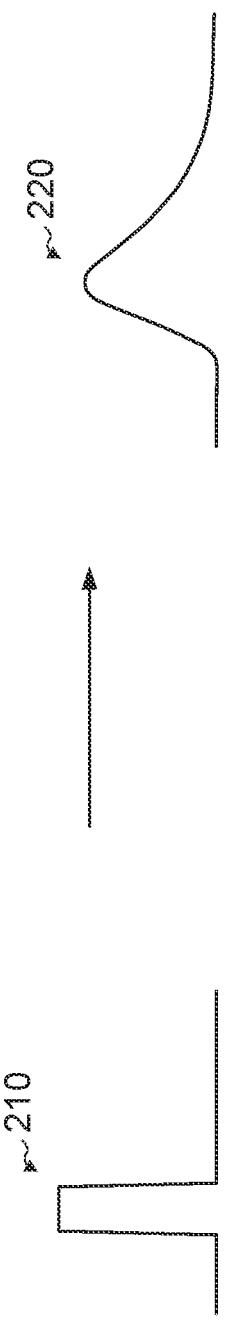
FIG. 2 shows an example of signal distortion caused by non-idealities in a serial link according to certain aspects of the present disclosure.

FIG. 2 shows an example in which the transmitter 112 transmits a symbol 210 representing a bit value of one across the link 130. As shown in FIG. 2, the symbol 220 received at the receiver 114 is distorted due to non-idealities in the link 130 (e.g., limited bandwidth of the link 130, reflections, etc.). In this example, the distortion spreads out the symbol 220 received at the receiver 114. This may cause the symbol 220 to spread into the next symbol (not shown) at the receiver 114, resulting in intersymbol interference (ISI).

To reduce ISI, the receiver 114 may employ decision feedback equalization. In this regard, FIG. 3 is a conceptual diagram showing an example of decision feedback equalization implemented in the receiver 114 according to certain aspects.

Figure 3:
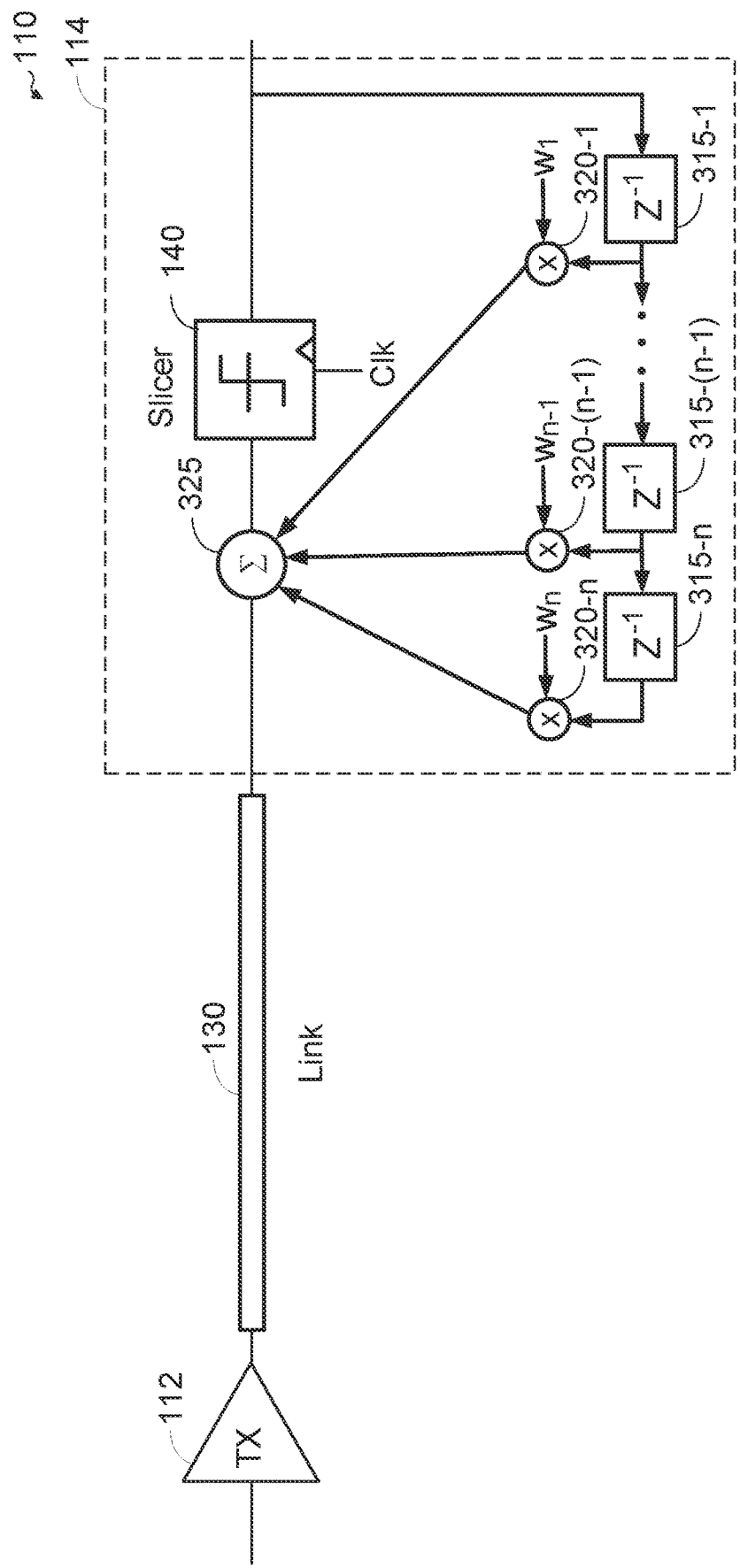
FIG. 3 shows a conceptual diagram of decision feedback equalization according to certain aspects of the present disclosure.

In the example in FIG. 3, the receiver 114 includes delay elements 315-1 to 315-n, multipliers 320-1 to 320-n, and a summer 325. The summer 325 may be coupled between the link 130 and the input of the slicer 140. The delay elements 315-1 to 315-n are coupled in series in which a first one of the delay elements 315-1 is coupled to the output of the slicer 140. Each of the multipliers 320-1 to 320-n is coupled to the output of a respective one of the delay elements 315-1 to 315-n and is configured to multiply the output of the respective one of the delay elements 315-1 to 315-n by a respective weight $W_1$ to $W_n$. Each weight $W_1$ to $W_n$ may be positive or negative. In the example in FIG. 3, the summer 325 is configured to sum the outputs of the multipliers 320-1 to 320-n with the current symbol received at the receiver 114.

In operation, the delay elements 315-1 to 315-n provide n previous bit decisions (e.g., n previous bit values) from the slicer 140. The multipliers 320-1 to 320-n multiply the n previous bit decisions by the respective weights $W_1$ to $W_n$, and the summer 325 sums the outputs of the multipliers 320-1 to 320-n to obtain a weighted sum of the n previous bit decisions and adds the weighted sum to the current symbol at the receiver 114. The weighted sum may be positive or negative.

Thus, a weighted sum of the n previous bit decisions is added to the current symbol to reduce ISI. The values of the weights $W_1$ to $W_n$ may be adjusted (i.e., programmed) according to the characteristics of the link 130 (e.g., frequency response of the link 130). FIG. 3 shows an example of n-tap decision feedback equalization in which a weighted sum of the n previous bit decisions is added to the current symbol. In this example, the decision feedback equalization implements a finite impulse response (FIR) filter in which the weights $W_1$ to $W_n$ correspond to the coefficients of the FIR filter.

It is to be appreciated that the exemplary decision feedback equalization conceptually illustrated in FIG. 3 may be implemented using any one of a variety of different circuits. Also, it is to be appreciated that decision feedback equalization may be implemented in various ways. For example, in some implementations, the slicer 140 may make a bit decision by comparing a voltage of the current symbol with a reference voltage. In these implementations, a weighted sum of the previous n bits may be added to the reference voltage instead of the current symbol to correct for ISI. It is also to be appreciated that two or more components shown in FIG. 3 may be combined into one component. It is also to be appreciated that a decision feedback equalizer may have any number of taps. For example, in some implementations, a decision feedback equalizer may have one tap (i.e., n=1) in which the most recent previous bit decision is weighted and added to the current symbol or the reference voltage. In other words, it is to be appreciated that FIG. 3 is intended to illustrate the concept of decision feedback equalization using an example and is not intended to limit the present disclosure to any one implementation of a decision feedback equalizer.

Figure 4:
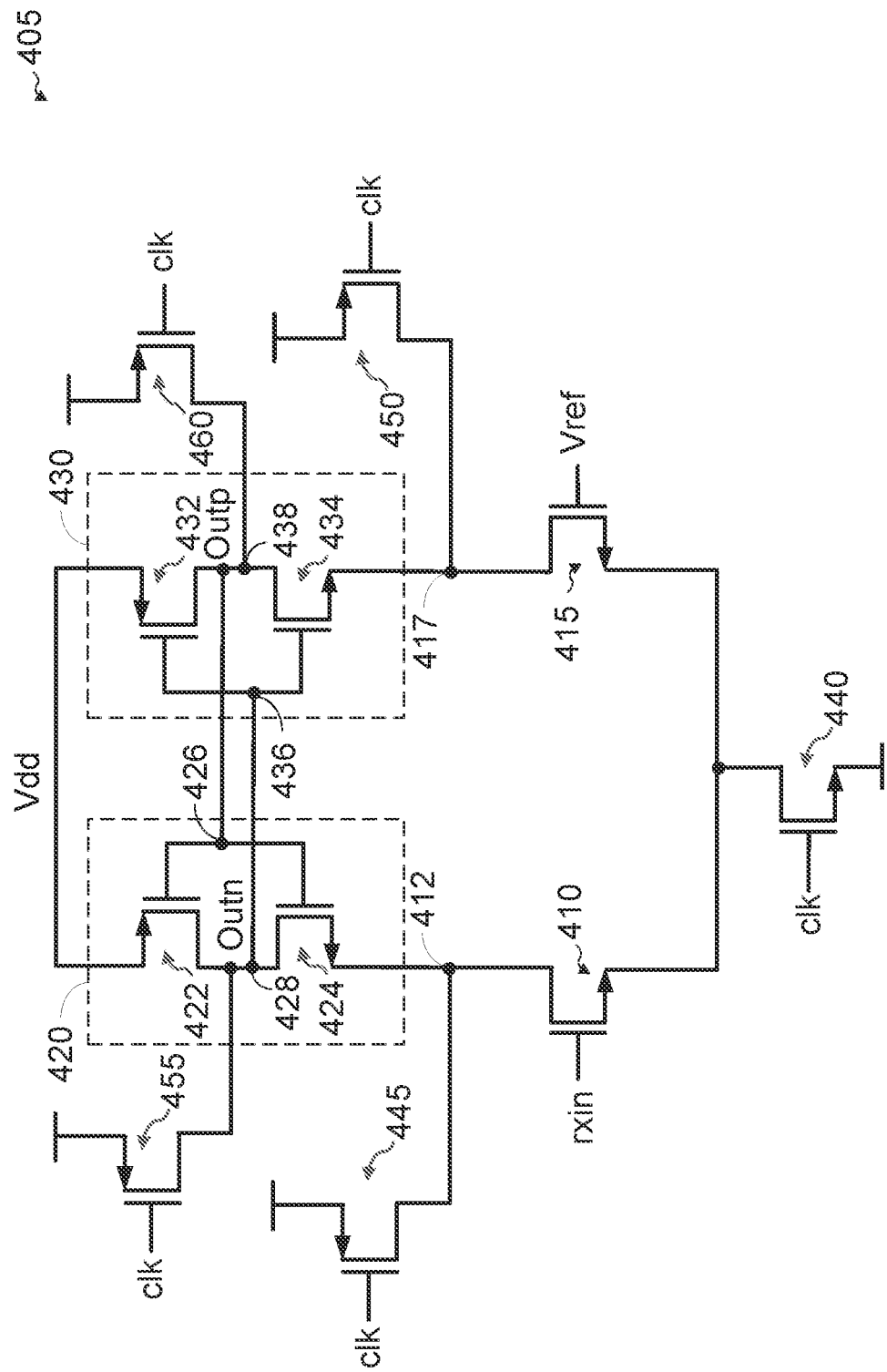
FIG. 4 shows an example of a comparator according to certain aspects of the present disclosure.

FIG. 4 shows an example of a comparator 405 that may be used to implement the slicer 140 according to certain aspects. It is to be appreciated that a comparator may also be referred to as a sense amplifier, a slicer, or another term.

In the example in FIG. 4, the comparator 405 includes a first input transistor 410, a second input transistor 415, a first inverter 420, a second inverter 430, a first switching transistor 440, a second switching transistor 445, a third switching transistor 450, a fourth switching transistor 455, and a fifth switching transistor 460. The first inverter 420 and the second inverter 430 are cross coupled to form a latch in which the input 426 of the first inverter 420 is coupled to the output 438 of the second inverter 430, and the input 436 of the second inverter 430 is coupled to the output 428 of the first inverter 420. As discussed further below, the cross coupling of the first inverter 420 and the second inverter 430 provides regenerative feedback that allows the comparator 405 to resolve a bit (i.e., make a bit decision).

In the example in FIG. 4, the first inverter 420 is a complementary inverter including a p-type field effect transistor (PFET) 422 and an n-type field effect transistor (NFET) 424. In this example, the source of the PFET 422 is coupled to the supply rail, the gate of the PFET 422 is coupled to the input 426, and the drain of the PFET 422 is coupled to the output 428. The supply rail provides a supply voltage Vdd, as shown in FIG. 4. Also, the drain of the NFET 424 is coupled to the output 428 and the gate of the NFET 424 is coupled to the input 426.

The second inverter 430 is a complementary inverter including a PFET 432 and an NFET 434. In this example, the source of the PFET 432 is coupled to the supply rail, the gate of the PFET 432 is coupled to the input 436, and the drain of the PFET 432 is coupled to the output 438. Also, the drain of the NFET 434 is coupled to the output 438 and the gate of the NFET 434 is coupled to the input 436.

The first input transistor 410 is configured to receive the input signal (labeled "rxin") of the comparator 405. The drain of the first input transistor 410 is coupled to the source of the NFET 424 of the first inverter 420, and the gate of the first input transistor 410 is coupled to the input of the comparator 405 (e.g., the input of the slicer 140 for the example where the slicer 140 is implemented with the comparator 405). A first node 412 is between the drain of the first input transistor 410 and the source of the NFET 424 of the first inverter 420, as shown in FIG. 4.

The second input transistor 415 is configured to receive a reference voltage (labeled "Vref"). As discussed further below, the comparator 405 compares the voltage of the input signal with the reference voltage Vref and makes a bit decision based on the comparison. The reference voltage Vref may come from a digital-to-analog converter (DAC) or another voltage reference. The drain of the second input transistor 415 is coupled to the source of the NFET 434 of the second inverter 430. A second node 417 is between the drain of the second input transistor 415 and the source of the NFET 434 of the second inverter 430, as shown in FIG. 4.

In the example in FIG. 4, each of the first input transistor 410 and the second input transistor 415 is implemented with a respective NFET. However, it is to be appreciated that the present disclosure is not limited to this example.

The first switching transistor 440 is coupled between the sources of the input transistors 410 and 415 and ground. In the example in FIG. 4, the first switching transistor 440 is implemented with an NFET, in which the gate of the first switching transistor 440 is driven by a clock signal (labeled "clk"). The clock signal may correspond to the sampling clock signal in FIGS. 1 and 2. The clock signal may be a periodic signal that oscillates between high (i.e., logic one) and low (i.e., logic zero) at a clock frequency. The clock signal may come from a phase-locked loop or another type of clock circuit.

The second switching transistor 445 is coupled between the first node 412 and the supply rail, and the third switching transistor 450 is coupled between the second node 417 and the supply rail. The gate of each of the second switching transistor 445 and the third switching transistor 450 is driven by the clock signal.

The fourth switching transistor 455 is coupled between the output 428 of the first inverter 420 and the supply rail, and the fifth switching transistor 460 is coupled between the output 438 of the second inverter 430 and the supply rail. The gate of each of the fourth switching transistor 455 and the fifth switching transistor 460 is driven by the clock signal. In the example in FIG. 4, each of the switching transistors 445, 450, 455, and 460 is implemented with a respective PFET.

In the example in FIG. 4, the comparator 405 has a first output (labeled "Outp") coupled to the output 438 of the second inverter 430, and a second output (labeled "Outn") coupled to the output 428 of the first inverter 420. As discussed further below, the first output Outp provides the bit decision (i.e., bit value) of the comparator 405 and the second output Outn provides the complement (i.e., inverse) of the bit decision.

Exemplary operations of the comparator 405 will now be discussed according to certain aspects.

When the clock signal is low, the comparator 405 is in a reset phase. During the reset phase, the first switching transistor 440 is turned off. This decouples the sources of the input transistors 410 and 415 from the ground, which disables the input transistors 410 and 415. Also, the second switching transistor 445 and the third switching transistor 450 are turned on. As a result, the second switching transistor 445 pulls the first node 412 to the supply voltage Vdd and the third switching transistor 450 pulls the second node 417 to the supply voltage Vdd. Further, the fourth switching transistor 455 and the fifth switching transistor 460 are turned on. As a result, the fourth switching transistor 455 pulls the output 428 of the first inverter 420 to the supply voltage Vdd and the fifth switching transistor 460 pulls the output 438 of the second inverter 430 to the supply voltage Vdd.

Thus, during the reset phase, the outputs 428 and 438 of the inverters 420 and 430 and the nodes 412 and 417 are pulled to the supply voltage Vdd (i.e., reset to Vdd). This causes the PFETs 422 and 432 and the NFETs 424 and 434 of the inverters 420 and 430 to turn off during the reset phase.

When the clock signal transitions from low to high, the comparator 405 enters a sensing phase. During the sensing phase, the first switching transistor 440 is turned on. This couples the sources of the input transistors 410 and 415 to the ground through the first switching transistor 440, which enables the input transistors 410 and 415. Also, the second switching transistor 445, the third switching transistor 450, the fourth switching transistor 455, and the fifth switching transistor 460 are turned off.

The input signal (labeled "rxin") is input to the gate of the first input transistor 410. If the voltage of the input signal exceeds the threshold voltage of the first input transistor 410, then the first input transistor 410 turns on and pulls the first node 412 low. Since the first node 412 is coupled to the source of the NFET 424 of the first inverter 420, pulling the first node 412 low increases the gate-to-source voltage of the NFET 424.

The reference voltage Vref is input to the gate of the second input transistor 415. Assuming the reference voltage Vref exceeds the threshold voltage of the second input transistor 415, the second input transistor 415 turns on and pulls the second node 417 low. Since the second node 417 is coupled to the source of the NFET 434 of the second inverter 430, pulling the second node 417 low increases the gate-to-source voltage of the NFET 434.

Assuming the first input transistor 410 and the second input transistor 415 have approximately the same threshold voltage, the nodes 412 and 417 are pulled low at different rates by the input transistors 410 and 415, respectively, depending on the voltage of the input signal and the reference voltage Vref. In the discussion below, the effects of ISI and offset voltage are ignored for simplicity.

If the voltage of the input signal is greater than the reference voltage Vref, then the first input transistor 410 pulls the first node 412 low at a faster rate than the second node 417. This causes the gate-to-source voltage of the NFET 424 to increase at a faster rate than the gate-to-source voltage of the NFET 434. When the gate-to-source voltage of the NFET 424 reaches the threshold voltage of the NFET 424, the NFET 424 turns on and pulls the output 428 of the first inverter 420 low. Since the output 428 of the first inverter 420 is coupled to the input 436 of the second inverter 430, this causes the PFET 432 of the second inverter 430 to turn on and pull the output 438 of the second inverter 430 high. Thus, in this case, the first output Outp of the comparator 405 (which is coupled to the output 438 of the second inverter 430) is pulled high, indicating a bit decision of one.

If the reference voltage Vref is greater than the voltage of the input signal, then the second input transistor 415 pulls the second node 417 low at a faster rate than the first node 412. This causes the gate-to-source voltage of the NFET 434 to increase at a faster rate than the gate-to-source voltage of the NFET 424. When the gate-to-source voltage of the NFET 434 reaches the threshold voltage of the NFET 434, the NFET 434 turns on and pulls the output 438 of the second inverter 430 low. Since the output 438 of the second inverter 430 is coupled to the input 426 of the first inverter 420, this causes the PFET 422 of the first inverter 420 to turn on and pull the output 428 of the first inverter 420 high. Thus, in this case, the first output Outp of the comparator 405 (which is coupled to the output 438 of the second inverter 430) is pulled low, indicating a bit decision of zero.

Thus, in this example, the comparator 405 makes a bit decision of one if the voltage of the input signal is greater than the reference voltage Vref and makes a bit decision of zero if the voltage of the input signal is less than the reference voltage Vref. In this example, the comparator 405 may make a bit decision during each period (i.e., cycle) of the clock signal.

Figure 5:
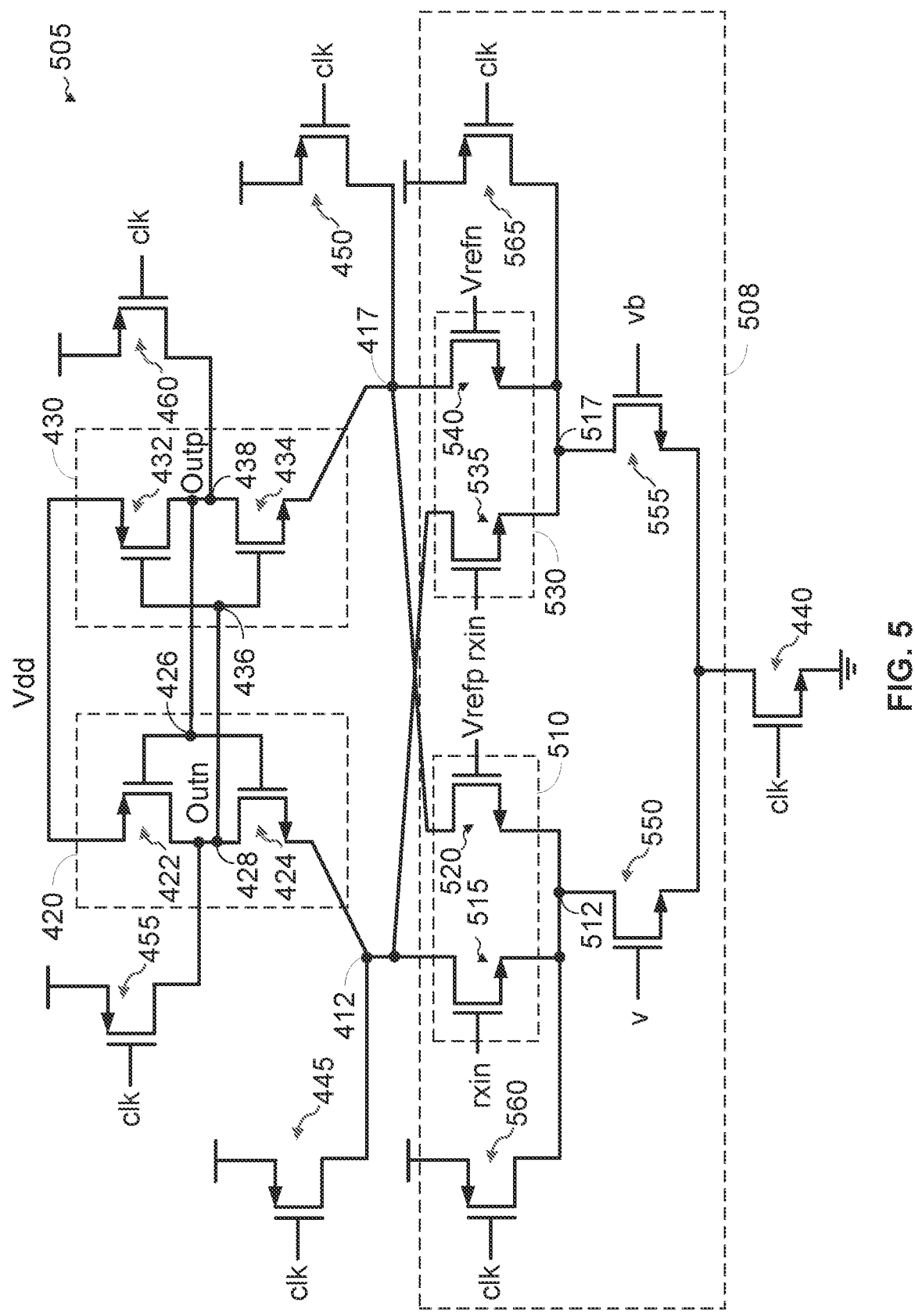
FIG. 5 shows an example of a comparator with decision feedback equalization according to certain aspects of the present disclosure.

Decision feedback equalization may be incorporated into a comparator. In this regard, FIG. 5 shows an example of a comparator 505 including a feedback circuit 508 to provide decision feedback equalization. In this example, the comparator 505 is obtained by replacing the first input transistor 410 and the second input transistor 415 in the comparator 405 shown in FIG. 4 with the feedback circuit 508. As discussed further below, the feedback circuit 508 provide decision feedback equalization by adding feedback of the previous bit decision to the reference voltage Vref.

In this example, the feedback circuit 508 includes a first input circuit 510, a second input circuit 530, a sixth switching transistor 550, a seventh switching transistor 555, an eighth switching transistor 560, and a ninth switching transistor 565. The first input circuit 510 is coupled between the nodes 412 and 417 and the sixth switching transistor 550, and the second input circuit 530 is coupled between the nodes 412 and 417 and the seventh switching transistor 555. In the example in FIG. 5, each of the switching transistors 550 and 555 is implemented with a respective NFET.

The drain of the sixth switching transistor 550 is coupled to the first input circuit 510 at a third node 512, and the source of the sixth switching transistor 550 is coupled to the drain of the first switching transistor 440. The drain of the seventh switching transistor 555 is coupled to the second input circuit 530 at a fourth node 517, and the source of the seventh switching transistor 555 is coupled to the drain of the first switching transistor 440. The gate of the sixth switching transistor 550 is driven by the previous bit decision (i.e., previous bit value), and the gate of the seventh switching transistor 555 is driven by the complement (i.e., inverse) of the previous bit decision (i.e., previous bit value). In FIG. 5, the previous bit value is labeled "v" and the complement of the previous bit value is labeled "vb". The previous bit value may come from a latch (not shown) configured to latch the previous bit value of the comparator 505 during the previous clock period. Alternatively, the previous bit value may come from another comparator that operates in a time-interleaved fashion with the comparator 505, as discussed further below.

As discussed further below, during the sensing phase, the sixth switching transistor 550 and the seventh switching transistor 555 are used to enable one of the first input circuit 510 and the second input circuit 530 based on the previous bit decision (i.e., previous bit value). More particularly, the sixth switching transistor 550 enables the first input circuit 510 when the previous bit value is one, and the seventh switching transistor 555 enables the second input circuit 530 when the previous bit value is zero.

The eighth switching transistor 560 is coupled between the third node 512 and the supply rail, and the ninth switching transistor 565 is coupled between the fourth node 517 and the supply rail. The gate of each of the eighth switching transistor 560 and the ninth switching transistor 565 is driven by the clock signal. In the example in FIG. 5, each of the switching transistors 560 and 565 is implemented with a respective PFET.

The first input circuit 510 includes a first input transistor 515 and a second input transistor 520. The first input transistor 515 is configured to receive the input signal (labeled "rxin") of the comparator 505. The drain of the first input transistor 515 is coupled to the first node 412 (which is coupled to the source of the NFET 424), the gate of the first input transistor 515 is coupled to the input of the comparator 505, and the source of the first input transistor 515 is coupled to the sixth switching transistor 550.

The second input transistor 520 is configured to receive a first compare voltage (labeled "Vrefp"). The first compare voltage is given by:

$$Vrefp = Vref +/- Vdce1 \quad (1)$$

where Vref is the reference voltage discussed above with reference to FIG. 4. Vdce1 is a decision feedback equalizer (DFE) coefficient correcting for ISI for the case where the previous bit value is one, and +/− indicates that Vdce1 may be positive or negative. This feedback corrects for ISI from the previous symbol for the case where the previous symbol has a bit value of one. As discussed above, the first input circuit 510 is enabled by the sixth switching transistor 550 when the previous bit value is one. The first compare voltage Vrefp may come from a DAC or another voltage reference. The drain of the second input transistor 520 is coupled to the second node 417 (which is coupled to the source of the NFET 434), the gate of the second input transistor 520 is coupled to the first compare voltage Vrefp, and the source of the second input transistor 520 is coupled to the sixth switching transistor 550. In the example in FIG. 5, each of the input transistors 515 and 520 is implemented with a respective NFET.

The second input circuit 530 includes a third input transistor 535 and a fourth input transistor 540. The third input transistor 535 is configured to receive the input signal (labeled "rxin") of the comparator 505. The drain of the third input transistor 535 is coupled to the first node 412 (which is coupled to the source of the NFET 424), the gate of the third input transistor 535 is coupled to the input of the comparator 505, and the source of the third input transistor 535 is coupled to the seventh switching transistor 555.

The fourth input transistor 540 is configured to receive a second compare voltage (labeled "Vrefn"). The second compare voltage is given by:

$$Vrefn = Vref +/- Vdce2 \quad (2)$$

where Vref is the reference voltage discussed above with reference to FIG. 4, Vdce2 is a DFE coefficient correcting for ISI for the case where the previous bit value is zero, and +/− indicates that Vdce2 may be positive or negative. As discussed above, the second input circuit 530 is enabled by the seventh switching transistor 555 when the previous bit value is zero. The second compare voltage may come from a DAC or another reference voltage. The drain of the fourth input transistor 540 is coupled to the second node 417 (which is coupled to the source of the NFET 434), the gate of the fourth input transistor 540 is coupled to the second compare voltage Vrefn, and the source of the fourth input transistor 540 is coupled to the seventh switching transistor 555. In the example in FIG. 5, each of the input transistors 535 and 540 is implemented with a respective NFET.

Exemplary operations of the comparator 505 will now be discussed according to certain aspects.

When the clock signal is low, the comparator 505 is in the reset phase. During the reset phase, the first switching transistor 440 is turned off, which disables the first input circuit 510 and the second input circuit 530. Also, the switching transistors 445, 450, 455, 460, 560, and 565 are turned on, which resets the outputs 428 and 438 of the inverters 420 and 430 and the nodes 412, 417, 512, and 517 to the supply voltage Vdd.

When the clock signal transitions from low to high, the comparator 505 enters the sensing phase. During the sensing phase, the sixth switching transistor 550 and the seventh switching transistor 555 enable one of the first input circuit 510 and the second input circuit 530 based on the previous bit value. If the previous bit value is one, then the sixth switching transistor 550 turns on and enables the first input circuit 510. In this case, the seventh switching transistor 555 is turned off. If the previous bit value is zero, then the seventh switching transistor 555 turns on and enables the second input circuit 530. In this case, the sixth switching transistor 550 is turned off.

For the case where the previous bit value is one, the first input circuit 510 compares the voltage of the input signal with the first compare voltage Vrefp. As discussed above, the first compare voltage Vrefp includes the DFE coefficient for the case where the previous bit value is one. If the voltage of the input signal is greater than the first compare voltage Vrefp, then the first input transistor 515 pulls the first node 412 low at a faster rate than the second node 417. This causes the inverters 420 and 430 (which are cross coupled) to latch a one at the first output Outp and latch a zero at the second output Outn. In this case, the comparator 505 makes a bit decision of one. If the first compare voltage Vrefp is greater than the voltage of the input signal, then the second input transistor 520 pulls the second node 417 low at a faster rate than the first node 412. This causes the inverters 420 and 430 to latch a zero at the first output Outp and a one at the second output Outn. In this case, the comparator 505 makes a bit decision of zero.

For the case where the previous bit value is zero, the second input circuit 530 compares the voltage of the input signal with the second compare voltage Vrefn. As discussed above, the second compare voltage Vrefn includes the DFE coefficient for the case where the previous bit value is zero. If the voltage of the input signal is greater than the second compare voltage Vrefn, then the third input transistor 535 pulls the first node 412 low at a faster rate than the second node 417. This causes the inverters 420 and 430 (which are cross coupled) to latch a one at the first output Outp and latch a zero at the second output Outn. In this case, the comparator 505 makes a bit decision of one. If the second compare voltage Vrefn is greater than the voltage of the input signal, then the fourth input transistor 540 pulls the second node 417 low at a faster rate than the first node 412. This causes the inverters 420 and 430 to latch a zero at the first output Outp and a one at the second output Outn. In this case, the comparator 505 makes a bit decision of zero.

Thus, the feedback circuit 508 provides the comparator 505 with one-tap decision feedback equalization by comparing the voltage of the input signal with the first compare voltage Vrefp when the previous bit value is one, and comparing the voltage of the input signal with the second compare voltage Vrefn when the previous bit value is zero.

A challenge with the comparator 505 shown in FIG. 5 is that the comparator 505 has a stack of five transistors between the supply rail and ground. The stack of five transistors may require a relatively high supply voltage Vdd to ensure enough headroom for proper operation of the comparator 505. This may make the comparator 505 unsuitable for low-voltage applications using a low supply voltage Vdd. A low supply voltage Vdd is desirable to reduce power consumption (e.g., when the system 110 is incorporated in a battery-power device)

To address the above challenge, aspects of the present disclosure provide a comparator incorporating decision feedback equalization with a folded topology that reduces the number of stacked transistors. This makes the comparator according to aspects of the present disclosure more suitable for low-voltage applications than the comparator 505, as discussed further below.

Figure 6:
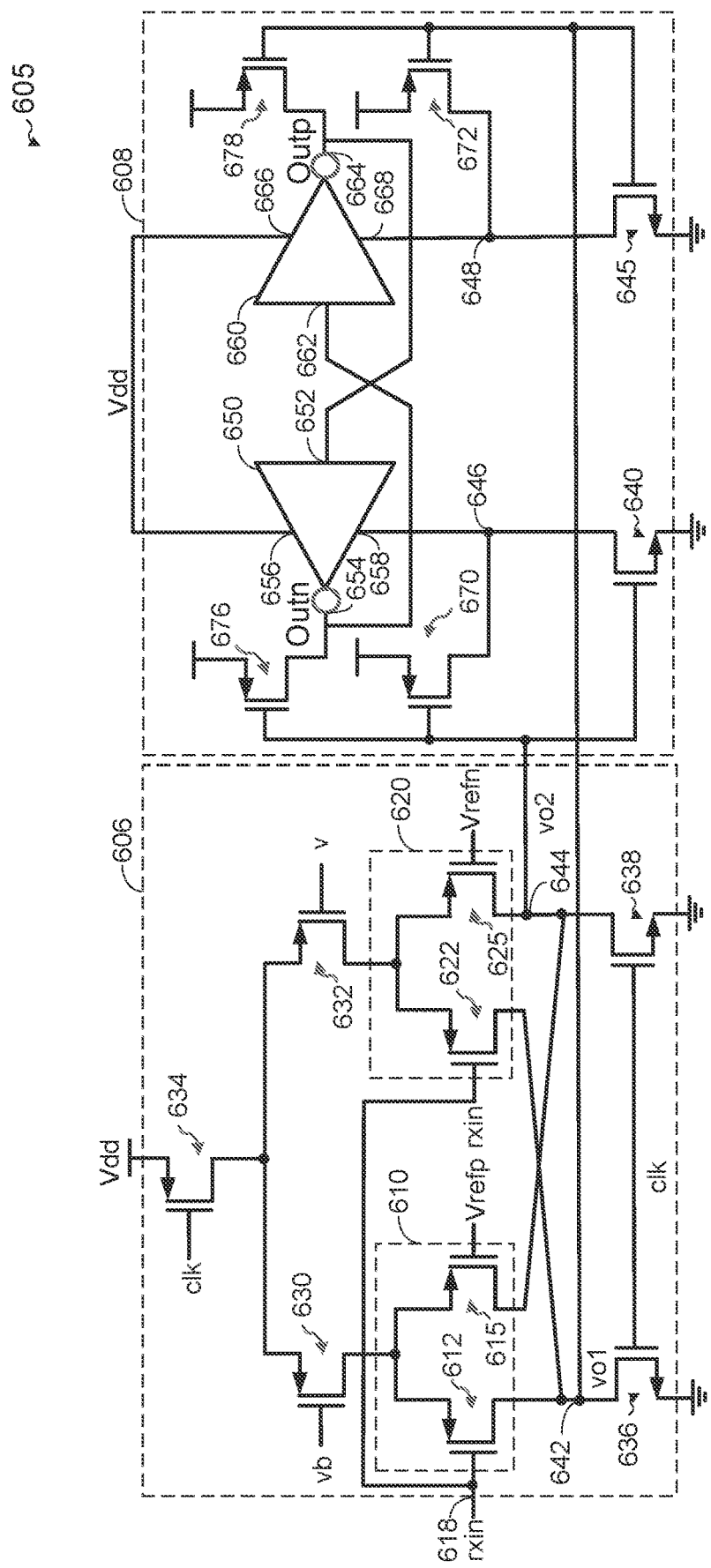
FIG. 6 shows an example of a folded comparator with decision feedback equalization according to certain aspects of the present disclosure.

FIG. 6 shows an example of a comparator 605 incorporating decision feedback equalization with a folded topology according to certain aspects. The comparator 605 may be used to implement the slicer 140 shown in FIGS. 1 and 2. The comparator 605 includes an input stage 606 and a regeneration stage 608.

The input stage 606 includes a first input circuit 610, a second input circuit 620, a first switching transistor 630, a second switching transistor 632, a third switching transistor 634, a fourth switching transistor 636, and a fifth switching transistor 638. In the example in FIG. 6, the source of the third switching transistor 634 is coupled to the supply rail and the gate of the third switching transistor 634 is driven by the clock signal (e.g., sampling clock signal in FIGS. 1 and 2). The source of the first switching transistor 630 is coupled to the drain of the third switching transistor 634, the gate of the first switching transistor 630 receives the complement of the previous bit value (labeled "vb"), and the drain of the first switching transistor 630 is coupled to the first input circuit 610. The source of the second switching transistor 632 is coupled to the drain of the third switching transistor 634, the gate of the second switching transistor 632 receives the previous hit value (labeled "v"), and the drain of the second switching transistor 632 is coupled to the second input circuit 620. As discussed further below, first switching transistor 630 and the second switching transistor 632 are used to enable (i.e., select) one of the first input circuit 610 and the second input circuit 620 based on the previous bit value. In the example in FIG. 6, each of the switching transistors 630, 632, and 634 is implemented with a respective PFET.

The drain of the fourth switching transistor 636 is coupled to the first and second input circuits 610 and 620 at a first node 642, the gate of the fourth switching transistor 636 is driven by the clock signal, and the source of the fourth switching transistor 636 is coupled to ground. The drain of the fifth switching transistor 638 is coupled to the first and second input circuits 610 and 620 at a second node 644, the gate of the fifth switching transistor 638 is driven by the clock signal, and the source of the fifth switching transistor 638 is coupled to ground. In the example in FIG. 6, each of the switching transistors 636 and 638 is implemented with a respective NFET. Each of the first node 642 and the second node 644 is an intermediate node in the comparator 605.

The first input circuit 610 includes a first input transistor 612 and a second input transistor 615. The first input transistor 612 is configured to receive the input signal (labeled "rxin") of the comparator 605. The drain of the first input transistor 612 is coupled to the first node 642, the gate of the first input transistor 612 is coupled to the input 618 of the comparator 605, and the source of the first input transistor 612 is coupled to the first switching transistor 630.

The second input transistor 615 is configured to receive a first compare voltage (labeled "Vrefp"). The first compare voltage is given by:

$$Vrefp = Vref +/- Vdce1 \qquad (3)$$

where Vref is the reference voltage discussed above with reference to FIG. 4, Vdce1 is the DFE coefficient correcting for ISI for the case where the previous bit value is one, and +/- indicates that Vdce1 may be positive or negative. As discussed further below, the first compare voltage Vrefp may also include an offset component to compensate for offset voltage in certain aspects. The first compare voltage Vrefp may come from a DAC or another voltage reference. The drain of the second input transistor 615 is coupled to the second node 644, the gate of the second input transistor 615 is coupled to the first compare voltage Vrefp. and the source of the second input transistor 615 is coupled to the first switching transistor 630. In the example in FIG. 6, each of the input transistors 612 and 615 is implemented with a respective PFET.

The second input circuit 620 includes a third input transistor 622 and a fourth input transistor 625. The third input transistor 622 is configured to receive the input signal (labeled "rxin") of the comparator 605. The drain of the third input transistor 622 is coupled to the first node 642, the gate of the third input transistor 622 is coupled to the input 618 of the comparator 605, and the source of the third input transistor 622 is coupled to the second switching transistor 632.

The fourth input transistor 625 is configured to receive a second compare voltage (labeled "Vrefn"). The second compare voltage is given by:

$$Vrefn = Vref +/- Vdce2 \qquad (4)$$

where Vref is the reference voltage discussed above with reference to FIG. 4, Vdce2 is the DFE coefficient correcting for ISI for the case where the previous bit value is zero, and +/- indicates that Vdce2 may be positive or negative. As discussed further below, the second compare voltage Vrefn may also include an offset component to compensate for offset voltage in certain aspects. The second compare voltage may come from a DAC or another voltage reference. The drain of the fourth input transistor 625 is coupled to the second node 644, the gate of the fourth input transistor 625 is coupled to the second compare voltage, and the source of the fourth input transistor 625 is coupled to the second switching transistor 632. In the example in FIG. 6, each of the input transistors 622 and 625 is implemented with a respective PFET.

The regeneration stage 608 includes a first inverter 650, a second inverter 660, a first drive transistor 640, a second drive transistor 645, a sixth switching transistor 670, a seventh switching transistor 672, an eighth switching transistor 676, and a ninth switching transistor 678.

The first inverter 650 and the second inverter 660 are cross coupled to form a latch in which the input 652 of the first inverter 650 is coupled to the output 664 of the second inverter 660, and the input 662 of the second inverter 660 is coupled to the output 654 of the first inverter 650. As discussed further below, the cross coupling of the first inverter 650 and the second inverter 660 provides regenerative feedback that allows the comparator 605 to resolve a bit (i.e., make a bit decision).

The first inverter 650 also has a first voltage terminal 656 and a second voltage terminal 658. The first voltage terminal 656 is coupled to the supply rail and the second voltage terminal 658 is coupled to a third node 646. The first inverter 650 is configured to pull the output 654 to approximately the voltage at the first voltage terminal 656 (e.g., supply voltage Vdd) when the input 652 is low and pull the output 654 to approximately the voltage at the second voltage terminal 658 when the input 652 is high.

The second inverter 660 also has a first voltage terminal 666 and a second voltage terminal 668. The first voltage terminal 666 is coupled to the supply rail and the second voltage terminal 668 is coupled to a fourth node 648. The second inverter 660 is configured to pull the output 664 to approximately the voltage at the first voltage terminal 666 (e.g., supply voltage Vdd) when the input 662 is low and pull the output 664 to approximately the voltage at the second voltage terminal 668 when the input 662 is high.

The drain of the first drive transistor 640 is coupled to the third node 646, the gate of the first drive transistor 640 is coupled to the second node 644, and the source of the first drive transistor 640 is coupled to ground. The drain of the second drive transistor 645 is coupled to the fourth node 648, the gate of the second drive transistor 645 is coupled to the first node 642, and the source of the second drive transistor 645 is coupled to ground. In the example in FIG. 6, each of the drive transistors 640 and 640 is implemented with a respective NFET.

The sixth switching transistor 670 is coupled between the third node 646 and the supply rail, and the eighth switching transistor 676 is coupled between the output 654 of the first inverter 650 and the supply rail. The gate of each of the switching transistors 670 and 676 is coupled to the second node 644.

The seventh switching transistor 672 is coupled between the fourth node 648 and the supply rail, and the ninth switching transistor 678 is coupled between the output 664 of the second inverter 660 and the supply rail. The gate of each of the switching transistors 672 and 678 is coupled to the first node 642.

In the example in FIG. 6, the comparator 605 has a first output (labeled "Outp") coupled to the output 664 of the second inverter 660, and a second output (labeled "Outn") coupled to the output 654 of the first inverter 650. As discussed further below, the first output Outp provides the bit decision (i.e., bit value) of the comparator 605 and the second output Outn provides the complement (i.e., inverse) of the bit decision.

Exemplary operations of the comparator 605 shown in the example in FIG. 6 will now be discussed according to certain aspects.

When the clock signal is high, the comparator 605 is in the reset phase. During the reset phase, the third switching transistor 634 is turned off, which disables the first input circuit 610 and the second input circuit 620. Also, the fourth switching transistor 636 and the fifth switching transistor 638 are turned on. As a result, the fourth switching transistor 636 and the fifth switching transistor 638 pull the first node 642 and the second node 644, respectively, to ground. The pulling down of the first node 642 and the second node 644 causes the switching transistors 670, 672, 676, and 678 in the regeneration stage 608 to turn on and reset the third node 646, the fourth node 648, and the outputs 654 and 664 of the inverters 650 and 660 to the supply voltage Vdd. Also, the first drive transistor 640 and the second drive transistor 645 are turned off.

When the clock signal transitions from high to low, the comparator 605 enters the sensing phase. During the sensing phase, the third switching transistor 634 turns on, and the fourth switching transistor 636 and the fifth switching transistor 638 turn off. Also, during the sensing phase, the first switching transistor 630 and the second switching transistor 632 enable (i.e., select) one of the first input circuit 610 and the second input circuit 620 based on the previous bit value. If the previous bit value is one, then the first switching transistor 630 turns on and enables (i.e., selects) the first input circuit 610. In this case, the second switching transistor 632 is turned off. If the previous bit value is zero, then the second switching transistor 632 turns on and enables (i.e., selects) the second input circuit 620. In this case, the first switching transistor 630 is turned off.

For the case where the previous bit value is one, the first input circuit 610 compares the voltage of the input signal with the first compare voltage Vrefp. As discussed above, the first compare voltage Vrefp includes the DFE coefficient correcting for ISI for the case where the previous bit value is one. The first input transistor 612 sources a first current to the first node 642 based on the voltage of the input signal, which pulls the first node 642 high (i.e., raises the voltage on the first node 642). The second input transistor 615 sources a second current to the second node 644 based on the first compare voltage Vrefp, which pulls the second node 644 high (i.e., raises the voltage on the second node 644). The voltage on the first node 642 and the voltage on the second node 644 rise at different rates depending on the voltage of the input signal and the first compare voltage Vrefp.

If the voltage of the input signal is greater than the first compare voltage Vrefp, then the second input transistor 615 pulls the second node 644 high at a faster rate than the first node 642. As a result, the voltage at the second node 644 (labeled "vo2") rises faster than the voltage at the first node 642 (labeled "vo1") in this case. When the voltage at the second node 644 reaches the threshold voltage of the first drive transistor 640, the first drive transistor 640 turns on and pulls the second voltage terminal 658 of the first inverter 650 to ground. This causes the first inverter 650 to turn on and output a zero since the input 652 was reset high (i.e., Vdd) in the reset phase. Since the output 654 of the first inverter 650 is coupled to the input 662 of the second inverter 660, this causes the second inverter 660 to output a one (e.g., Vdd). In this case, the comparator 605 outputs a one at the first output Outp and a zero at the second output Outn.

If, on the other hand, the voltage of the input signal is less than the first compare voltage Vrefp, then the first input transistor 612 pulls the first node 642 high at a faster rate than the second node 644. As a result, the voltage at the first node 642 (labeled "vo1") rises faster than the voltage at the second node 644 (labeled "vo2") in this case. When the voltage at the first node 642 reaches the threshold voltage of the second drive transistor 645, the second drive transistor 645 turns on and pulls the second voltage terminal 668 of the second inverter 660 to ground. This causes the second inverter 660 to turn on and output a zero since the input 662 was reset high (i.e., Vdd) in the reset phase. Since the output 664 of the second inverter 660 is coupled to the input 652 of the first inverter 650, this causes the first inverter 650 to output a one (e.g., Vdd). In this case, the comparator 605 outputs a zero at the first output Outp and a one at the second output Outn.

For the case where the previous hit value is zero, the second input circuit 620 compares the voltage of the input signal with the second compare voltage Vrefn. As discussed above, the second compare voltage Vrefn includes the DFE coefficient correcting for ISI for the case where the previous bit value is zero. The third input transistor 622 sources a third current to the first node 642 based on the voltage of the input signal, which pulls the first node 642 high (i.e., raises vo1). The fourth input transistor 625 sources a second current to the second node 644 based on the second compare voltage Vrefn, which pulls the second node 644 high (i.e., raises vo2). The voltage on the first node 642 and the voltage on the second node 644 rise at different rates depending on the voltage of the input signal and the second compare voltage Vrefn.

If the voltage of the input signal is greater than the second compare voltage Vrefn, then the fourth input transistor 625 pulls the second node 644 high at a faster rate than the first node 642. As a result, the voltage at the second node 644 (labeled "vo2") rises faster than the voltage at the first node 642 (labeled "vo1") in this case. When the voltage at the second node 644 reaches the threshold voltage of the first drive transistor 640, the first drive transistor 640 turns on and pulls the second voltage terminal 658 of the first inverter 650 to ground. This causes the first inverter 650 to turn on and output a zero since the input 652 was reset high (i.e., Vdd) in the reset phase. Since the output 654 of the first inverter 650 is coupled to the input 662 of the second inverter 660, this causes the second inverter 660 to output a one (e.g., Vdd). In this case, the comparator 605 outputs a one at the first output Outp and a zero at the second output Outn.

If, on the other hand, the voltage of the input signal is less than the second compare voltage Vrefn, then the third input transistor 622 pulls the first node 642 high at a faster rate than the second node 644. As a result, the voltage at the first node 642 (labeled "vo1") rises faster than the voltage at the second node 644 (labeled "vo2") in this case. When the voltage at the first node 642 reaches the threshold voltage of the second drive transistor 645, the second drive transistor 645 turns on and pulls the second voltage terminal 668 of the second inverter 660 to ground. This causes the second inverter 660 to turn on and output a zero since the input 662 was reset high (i.e., Vdd) in the reset phase. Since the output 664 of the second inverter 660 is coupled to the input 652 of the first inverter 650, this causes the first inverter 650 to output a one (e.g., Vdd). In this case, the comparator 605 outputs a zero at the first output Outp and a one at the second output Outn.

Thus, the comparator 605 incorporates decision feedback equalization in which first input circuit 610 compares the voltage of the input signal with the first compare voltage Vrefp when the previous bit value is one, and the second input circuit 620 compares the voltage of the input signal with the second compare voltage Vrefn when the previous bit value is zero.

In this example, the comparator 605 has a folded topology in which the comparator 605 is folded where the input stage 606 couples to the regeneration stage 608. The folding is facilitated by making the input transistors 612, 615, 622, and 625 of a different channel type than the drive transistors 640 and 645. In the example shown in FIG. 6, each of the input transistors 612, 615, 622, and 625 is implemented with a respective PFET and each of the drive transistors 645 is implemented with a respective NFET. However, it is to be appreciated that, in other implementations, each of the input transistors 612, 615, 622, and 625 may be implemented with a respective NFET and each of the drive transistors 645 may be implemented with a respective PFET, as discussed further below with reference to FIG. 9.

The folded topology reduces the number of stacked transistors compared with the comparator 505 in FIG. 5. For example, in the example in FIG. 6, the input stage 606 has four stacked transistors, and the regeneration stage 608 has three stacked transistors assuming each inverter 650 and 660 in the regeneration stage 608 has two stacked transistors. In contrast, the comparator 505 has five stacked transistors. The lower number of stacked transistors allows the comparator 605 to operate at lower supply voltages than the comparator 505 and is therefore suitable for low-voltage operation, which reduces power consumption. The lower number of stacked transistors also allows the regeneration stage 608 to operate faster and thus make a bit decision faster, which reduces data-dependency effects in the decision feedback loop.

In other words, the folded topology allows the input stage 606 and the regeneration stage 608 to be arranged in parallel between the supply rail and ground to reduce the number of stacked transistors. Because the input stage 606 and the regeneration stage 608 are arranged in parallel, the transistors in the input stage 606 are not stacked with the transistors in the regeneration stage 608. In contrast, the input stage and the regeneration stage in the comparator 505 in FIG. 5 are stacked between the supply rail and ground which increases the number of stacked transistors and requires a higher supply voltage for operation.

Figure 7:
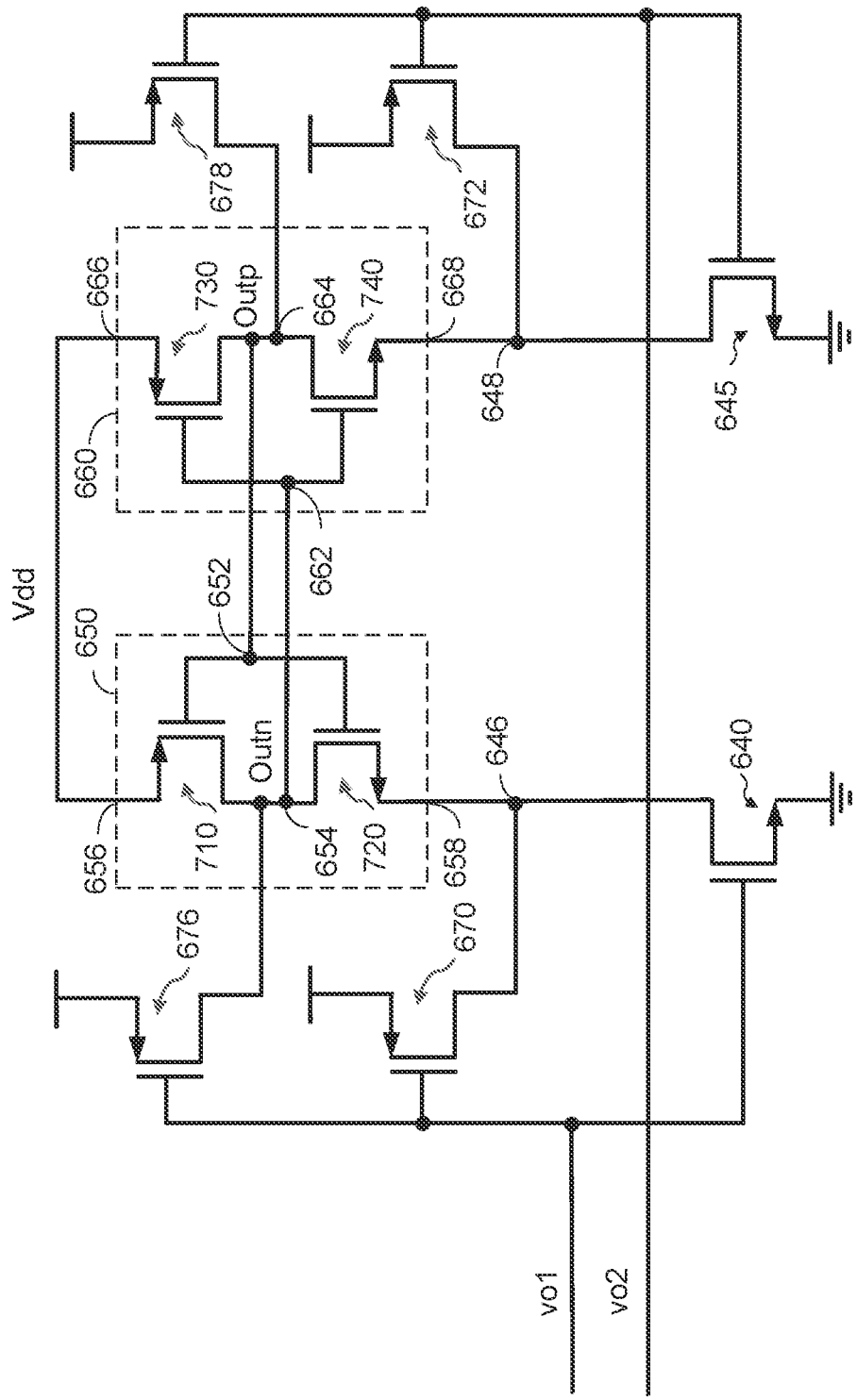
FIG. 7 shows an exemplary implementation of cross-coupled inverters according to certain aspects of the present disclosure.

FIG. 7 shows an exemplary implementation of the first inverter 650 and the second inverter 660 according to certain aspects. In this example, each of the inverters 650 and 660 includes a complementary pair of transistors.

More particularly, the first inverter 650 includes a respective PFET 710 and a respective NFET 720. The source of the PFET 710 is coupled to the first voltage terminal 656, the drain of the PFET 710 is coupled to the output 654, and the gate of the PFET 710 is coupled to the input 652. The source of the NFET 720 is coupled to the second voltage terminal 658, the drain of the NFET 720 is coupled to the output 654, and the gate of the NFET 720 is coupled to the input 652.

The second inverter 660 includes a respective PFET 730 and a respective NFET 740. The source of the PFET 730 is coupled to the first voltage terminal 666, the drain of the PFET 730 is coupled to the output 664, and the gate of the PFET 730 is coupled to the input 662. The source of the NFET 740 is coupled to the second voltage terminal 668, the drain of the NFET 740 is coupled to the output 664, and the gate of the NFET 740 is coupled to the input 662.

Ideally, for a comparator having a pair of input transistors, the output of the comparator is in a metastable state when the same voltage is input to both input transistors. In this ideal case, the output of the comparator toggles when the voltage input to one of the input transistors is slightly changed. However, due to offset voltage, a comparator deviates from the ideal case in which the output of the comparator is in the metastable state when two different voltages that differ by the offset voltage are input to the input transistors. The offset voltage may be caused by mismatches between transistors in the comparator (e.g., mismatches between the input transistors) and/or other non-idealities in the comparator.

Figure 8:
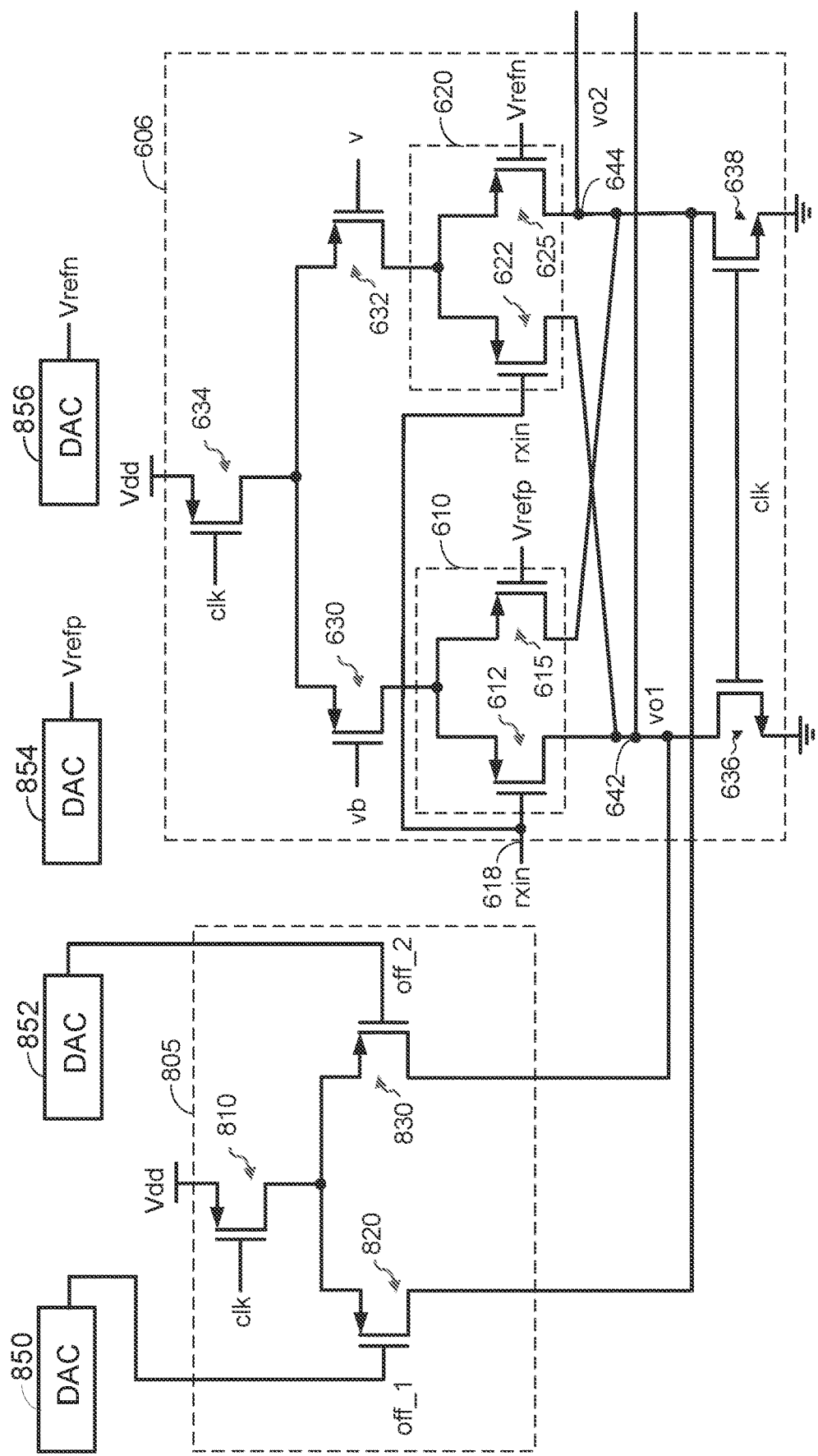
FIG. 8 shows an example of an offset circuit according to certain aspects of the present disclosure.

To address offset voltage, the comparator 605 may include an offset-cancellation circuit 805 (also referred to as an offset compensation circuit), an example of which is shown in FIG. 8 according to certain aspects. In this example, the offset-cancellation circuit 805 is arranged in parallel with the input stage 606, and therefore does not increase the number of stacked transistors in the input stage 606.

The offset-cancellation circuit 805 includes a switching transistor 810, a first offset transistor 820, and a second offset transistor 830. The source of the switching transistor 810 is coupled to the supply rail, and the gate of the switching transistor 810 is driven by the clock signal. The source of the first offset transistor 820 is coupled to the drain of the switching transistor 810, the gate of the first offset transistor 820 is coupled to a first offset-cancellation voltage (labeled "off_1"), and the drain of the first offset transistor 820 is coupled to the second node 644. The source of the second offset transistor 830 is coupled to the drain of the switching transistor 810, the gate of the second offset transistor 830 is coupled to a second offset-cancellation voltage (labeled "off_2"), and the drain of the second offset transistor 830 is coupled to the first node 642. In the example in FIG. 8, the switching transistor 810 is implemented with a respective PFET, and each of the offset transistors 820 and 830 is implemented with a respective PFET.

In certain aspects, the first offset-cancellation voltage off_1 may be provided by a first DAC 850 and the second offset-cancellation voltage off_2 may be provided by a second DAC 852. In the example in FIG. 8, the first DAC 850 is coupled to the gate of the first offset transistor 820 and the second DAC 852 is coupled to the gate of the second offset transistor 830. The first DAC 850 is configured to receive a first digital code, generate the first offset-cancellation voltage off_1 based on the first digital code, and output the first offset-cancellation voltage off_1 to the gate of the first offset transistor 820. The second DAC 852 is configured to receive a second digital code, generate the second offset-cancellation voltage off_2 based on the second digital code, and output the second offset-cancellation voltage off_2 to the gate of the second offset transistor 830. In this example, the first DAC 850 and the second DAC 852 allow the first offset-cancellation voltage off_1 and the second offset-cancellation voltage off_2 to be individually programmed using respective digital codes.

Offset voltage cancellation (also referred to as offset compensation) will now be discussed for the case where the first input circuit 610 is enabled according to certain aspects. Ideally, when the same voltage is input to the first and second input transistors 612 and 615, the current flowing from the first input transistor 612 to the first node 642 and the current flowing from the second input transistor 615 to the second node 644 are the same. However, due to offset voltage between the first input transistor 612 and the second input transistor 615, the currents are different, which causes the voltage vo1 at the first node 642 to rise at a different rate than the voltage vo2 at the second node 644.

To compensate for the above offset voltage, the first offset-cancellation voltage off_1 and/or the second offset-cancellation voltage off_2 may be programmed such that the total current flowing from the second offset transistor 830 and the first input transistor 612 to the first node 642 is approximately equal to the total current flowing from the first offset transistor 820 and the second input transistor 615 to the second node 644 when the same voltage is input to the gates of the input transistors 612 and 615. This way, the voltage vo1 at the first node 642 and the voltage vo2 at the second node 644 rise at approximately the same rate when the same voltage is input to the input transistors 612 and 615.

Offset voltage cancellation will now be discussed for the case where the second input circuit 620 is enabled according to certain aspects. Ideally, when the same voltage is input to the third and fourth input transistors 622 and 625, the current flowing from the third input transistor 622 to the first node 642 and the current flowing from the fourth input transistor 625 to the second node 644 are the same. However, due to offset voltage between the third input transistor 622 and the fourth input transistor 625, the currents are different, which causes the voltage vo1 at the first node 642 to rise at a different rate than the voltage vo2 at the second node 644.

To compensate for the above offset voltage, the first offset-cancellation voltage off_1 and/or the second offset-cancellation voltage off_2 may be programmed such that the total current flowing from the second offset transistor 830 and the third input transistor 622 to the first node 642 is approximately equal to the total current flowing from the first offset transistor 820 and the fourth input transistor 625 to the second node 644 when the same voltage is input to the gates of the input transistors 622 and 625. This way, the voltage vo1 at the first node 642 and the voltage vo2 at the second node 644 rise at approximately the same rate when the same voltage is input to the input transistors 622 and 625.

For the case where the offset voltage between the third input transistor 622 and the fourth input transistor 625 is approximately the same as the offset voltage between the first input transistor 612 and the second input transistor 615, the same offset-cancellation voltages off_1 and off_2 may be used for both the first input circuit 610 and the second input circuit 620 to provide offset voltage cancellation.

In certain aspects, offset cancellation may also be performed by including a first offset-cancellation component in the first compare voltage Vrefp and/or including a second offset-cancellation component in the second compare voltage Vrefn. This technique may be used as an alternative to the offset-cancellation circuit 805 or in combination with the offset-cancellation circuit 805 (e.g., to provide an extended offset cancellation range and to reduce the size of the offset transistors 820 and 830 and reduce loading on the vo1 and vo2).

In certain aspects, the first compare voltage Vrefp may be given by:

$$Vrefp = Vref +/- Vdce1 +/- Voff1 \qquad (5)$$

where Voff1 is a first offset-cancellation component, and +/− in front of Voff1 indicates that Voff1 may be positive or negative. In certain aspects, the first offset-cancellation component Voff1 may be a voltage that is approximately equal to the negative of the offset voltage between the first input transistor 612 and the second input transistor 615 to cancel the offset voltage. In certain aspects, the first compare voltage is provided by a third DAC 854. The third DAC 854 is coupled to the gate of the second input transistor 615. The third DAC 854 is configured to receive a third digital code, generate the first compare voltage based on the third digital code, and output the first compare voltage. The third DAC 854 allows the first offset-cancellation voltage in the first compare voltage to be programmed using the third digital code.

In certain aspects, the second compare voltage Vrefn may be given by:

$$Vrefn = Vref +/- Vdce1 +/- Voff2 \qquad (6)$$

where Voff2 is a second offset-cancellation component, and +/− in front of Voff2 indicates that Voff2 may be positive or negative. In certain aspects, the second offset-cancellation component Voff2 may be voltage that is approximately equal to the negative of the offset voltage between the third input transistor 622 and the fourth input transistor 625 to cancel the offset voltage. In certain aspects, the second compare voltage is provided by a fourth DAC 856. The fourth DAC 856 is coupled to the gate of the fourth input transistor 625. The fourth DAC 856 is configured to receive a fourth digital code, generate the second compare voltage based on the fourth digital code, and output the second compare voltage. The fourth DAC 856 allows the second offset-cancellation voltage in the second compare voltage to be programmed using the fourth digital code.

Each of the DACs 850, 852, 854, and 856 may be implemented using any one of a variety of circuits including, for example, a resistive voltage divider, a switched capacitor DAC, a resistor ladder DAC (e.g., R-2R ladder DAC), and/or another circuit.

In this example, the third DAC 854 and the fourth DAC 856 are used to implement 1-tap DFE as well as offset cancellation by including the offset-cancellation components Voff1 and Voff2 in the first and second compare voltages Vrefp and Vrefn, respectively.

Thus, offset voltage cancellation may be achieved using the offset-cancellation circuit 805, including the offset-cancellation components Voff1 and Voff2 in the first and second compare voltages Vrefp and Vrefn, respectively, or both. For example, the offset-cancellation components Voff1 and Voff2 may be used in combination with the offset-cancellation circuit 805 to provide an extended offset cancellation range. In this example, the offset-cancellation circuit 805 and the offset-cancellation components Voff1 and Voff2 may both contribute to offset voltage cancellation to increase the offset cancellation range of the comparator 605.

The offset-cancellation components Voff1 and Voff2 may also be used in combination with the offset-cancellation circuit 805 to reduce the sizes of the offset transistors 820 and 830, which reduces the loading on the intermediate nodes 642 and 644. This is because the offset-cancellation components Voff1 and Voff2 provide a portion of the overall offset cancellation range of the comparator 605. As a result, the offset-cancellation components Voff1 and Voff2 allow the comparator 605 to achieve a given offset-cancellation range using smaller sizes (i.e., dimensions) for the offset transistors 820 and 830 in the offset-cancellation circuit 805. The smaller sizes of the offset transistors 820 and 830 reduce the capacitive loading of the offset transistors 820 and 830 on the intermediate nodes 642 and 644. The reduced capacitive loading increases the speed of the comparator 605, allowing the comparator 605 to make a bit decision faster. In contrast, achieving the same offset-cancellation range using only the offset-cancellation circuit 805 would require increasing the sizes of the offset transistors 820 and 830, which would significantly increase the capacitive loading on the intermediate nodes 642 and 644 and degrade the speed of the comparator 605.

In the example in FIG. 6, each of the first switching transistor 630, the second switching transistor 632, the third switching transistor 634, the first input transistor 612, the second input transistor 615, the third input transistor 622, the fourth input transistor 625, the sixth switching transistor 670, the seventh switching transistor 672, the eighth switching transistor 676, and the ninth switching transistor 678 is implemented with a respective PFET. Also, each of the fourth switching transistor 636, the fifth switching transistor 638, the first drive transistor 640, and the second drive transistor 645 is implemented with a respective NFET.

Figure 9:
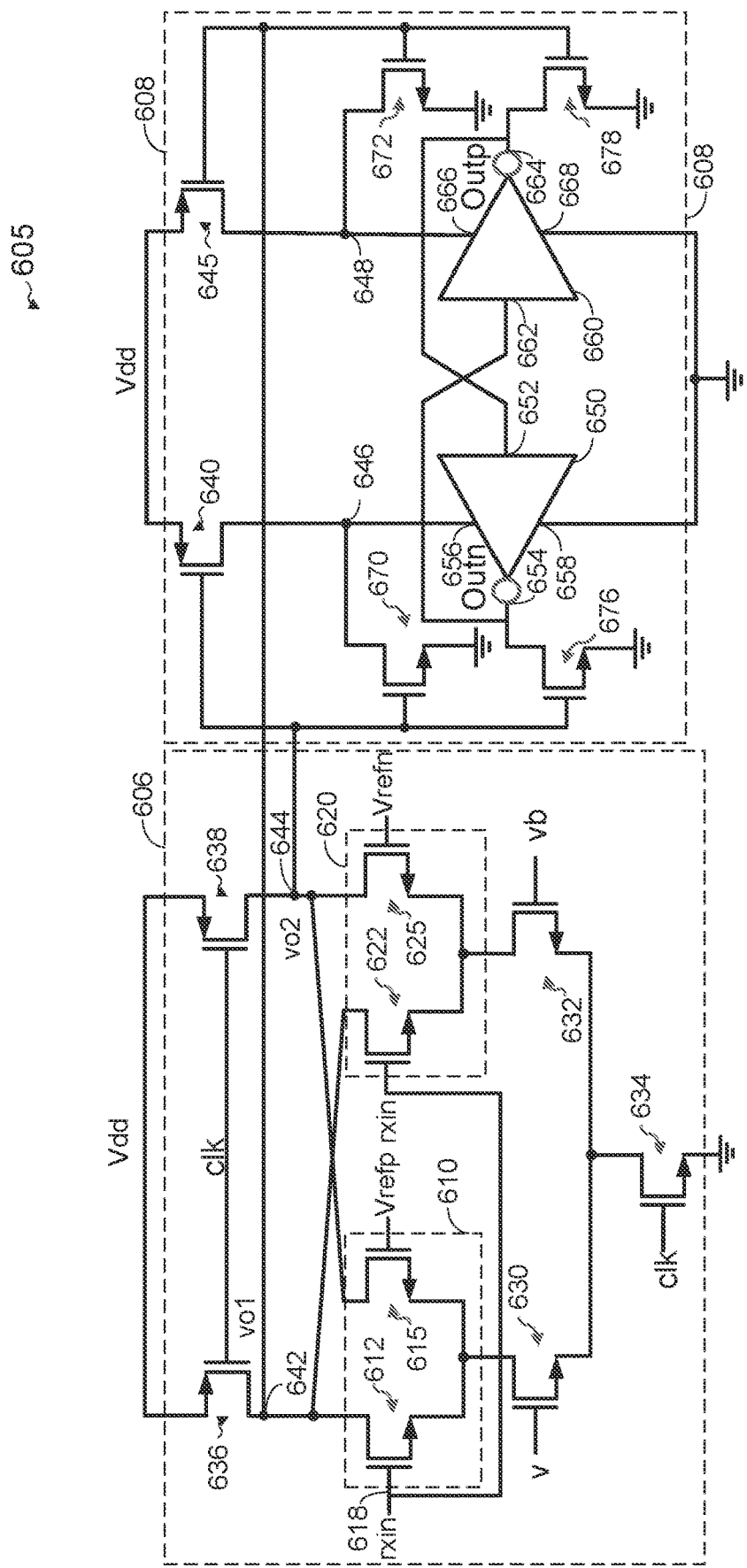
FIG. 9 shows another example of a folded comparator with decision feedback equalization according to certain aspects of the present disclosure.

However, it is to be appreciated that the comparator 605 is not limited to this example shown in FIG. 6. In this regard, FIG. 9 shows an example where each of the first switching transistor 630, the second switching transistor 632, the third switching transistor 634, the first input transistor 612, the second input transistor 615, the third input transistor 622, the fourth input transistor 625, the sixth switching transistor 670, the seventh switching transistor 672, the eighth switching transistor 676, and the ninth switching transistor 678 is implemented with a respective NFET. Also, in this example, each of the fourth switching transistor 636, the fifth switching transistor 638, the first drive transistor 640, and the second drive transistor 645 is implemented with a respective PFET.

In this example, the source of the third switching transistor 634 is coupled to ground and the gate of the third switching transistor 634 is driven by the clock signal (e.g., sampling clock signal in FIGS. 1 and 2). The source of the first switching transistor 630 is coupled to the drain of the third switching transistor 634, the gate of the first switching transistor 630 receives the previous bit value (labeled "v"), and the drain of the first switching transistor 630 is coupled to the first input circuit 610. The source of the second switching transistor 632 is coupled to the drain of the third switching transistor 634, the gate of the second switching transistor 632 receives the complement of the previous bit value (labeled "vb"), and the drain of the second switching transistor 632 is coupled to the second input circuit 620.

The drain of the fourth switching transistor 636 is coupled to the first and second input circuits 610 and 620 at the first node 642, the gate of the fourth switching transistor 636 is driven by the clock signal, and the source of the fourth switching transistor 636 is coupled to the supply rail. The drain of the fifth switching transistor 638 is coupled to the first and second input circuits 610 and 620 at the second node 644, the gate of the fifth switching transistor 638 is driven by the clock signal, and the source of the fifth switching transistor 638 is coupled to supply rail.

The drain of the first input transistor 612 is coupled to the first node 642, the gate of the first input transistor 612 is coupled to the input 618 of the comparator 605, and the source of the first input transistor 612 is coupled to the first switching transistor 630. The drain of the second input transistor 615 is coupled to the second node 644, the gate of the second input transistor 615 is coupled to the first compare voltage Vrefp, and the source of the second input transistor 615 is coupled to the first switching transistor 630.

The drain of the third input transistor 622 is coupled to the first node 642, the gate of the third input transistor 622 is coupled to the input 618 of the comparator 605, and the source of the third input transistor 622 is coupled to the second switching transistor 632. The drain of the fourth input transistor 625 is coupled to the second node 644, the gate of the fourth input transistor 625 is coupled to the second compare voltage Vrefn, and the source of the fourth input transistor 625 is coupled to the second switching transistor 632.

In the example in FIG. 9, the second voltage terminal 658 of the first inverter 650 is coupled to ground and the first voltage terminal 656 of the first inverter 650 is coupled to the third node 646. The second voltage terminal 668 of the second inverter 660 is coupled to ground and the first voltage terminal 666 of the second inverter 660 is coupled to the fourth node 648.

The drain of the first drive transistor 640 is coupled to the third node 646, the gate of the first drive transistor 640 is coupled to the second node 644, and the source of the first drive transistor 640 is coupled to the supply rail. The drain of the second drive transistor 645 is coupled to the fourth node 648, the gate of the second drive transistor 645 is coupled to the first node 642, and the source of the second drive transistor 645 is coupled to the supply rail.

The sixth switching transistor 670 is coupled between the third node 646 and ground, and the eighth switching transistor 676 is coupled between the output 654 of the first inverter 650 and ground. The gate of each of the switching transistors 670 and 676 is coupled to the second node 644.

The seventh switching transistor 672 is coupled between the fourth node 648 and ground, and the ninth switching transistor 678 is coupled between the output 664 of the second inverter 660 and ground. The gate of each of the switching transistors 672 and 678 is coupled to the first node 642.

Exemplary operations of the comparator 605 shown in the example in FIG. 9 will now be discussed according to certain aspects.

When the clock signal is low, the comparator 605 is in the reset phase. During the reset phase, the third switching transistor 634 is turned off, which disables the first input circuit 610 and the second input circuit 620. Also, the fourth switching transistor 636 and the fifth switching transistor 638 are turned on. As a result, the fourth switching transistor 636 and the fifth switching transistor 638 pull the first node 642 and the second node 644, respectively, to the supply voltage Vdd. Also, the first drive transistor 640 and the second drive transistor 645 are turned off.

When the clock signal transitions from low to high, the comparator 605 enters the sensing phase. During the sensing phase, the third switching transistor 634 turns on, and the fourth switching transistor 636 and the fifth switching transistor 638 turn off. Also, during the sensing phase, the first switching transistor 630 and the second switching transistor 632 enable (i.e., select) one of the first input circuit 610 and the second input circuit 620 based on the previous bit value. If the previous bit value is one, then the first switching transistor 630 turns on and enables (i.e., selects) the first input circuit 610. In this case, the second switching transistor 632 is turned off. If the previous bit value is zero, then the second switching transistor 632 turns on and enables (i.e., selects) the second input circuit 620. In this case, the first switching transistor 630 is turned off.

For the case where the previous bit value is one, the first input circuit 610 compares the voltage of the input signal with the first compare voltage Vrefp. As discussed above, the first compare voltage Vrefp includes the DFE coefficient correcting for ISI for the case where the previous bit value is one. The first input transistor 612 pulls a first current from the first node 642 based on the voltage of the input signal, which pulls the first node 642 low (i.e., lowers vo1). The second input transistor 615 pulls a second current from the second node 644 based on the first compare voltage Vrefp, which pulls the second node 644 low (i.e., lowers vo2). The voltage on the first node 642 and the voltage on the second node 644 fall at different rates depending on the voltage of the input signal and the first compare voltage Vrefp.

If the voltage of the input signal is greater than the first compare voltage Vrefp, then the first input transistor 612 pulls the first node 642 low at a faster rate than the second node 644. As a result, the voltage vo1 falls faster than the voltage vo2 in this case. When the voltage at the first node 642 drops to a voltage equal to Vdd minus the threshold voltage of the second drive transistor 645, the second drive transistor 645 turns on and pulls the first voltage terminal 666 of the second inverter 660 to Vdd. This causes the second inverter 660 to turn on and output a one since the input 662 was reset low in the reset phase. In this case, the comparator 605 outputs a one at the first output Outp and a zero at the second output Outn.

If, on the other hand, the voltage of the input signal is less than the first compare voltage Vrefp, then the second input transistor 615 pulls the second node 644 low at a faster rate than the first node 642. As a result, the voltage vo2 falls faster than the voltage vo1 in this case. When the voltage at the second node 644 falls to a voltage equal to Vdd minus the threshold voltage of the first drive transistor 640, the first drive transistor 640 turns on and pulls the first voltage terminal 656 of the first inverter 650 to Vdd. This causes the first inverter 650 to turn on and output a one since the input 652 was reset low in the reset phase. In this case, the comparator 605 outputs a one at the second output Outn and a zero at the first output Outp.

For the case where the previous bit value is zero, the second input circuit 620 compares the voltage of the input signal with the second compare voltage Vrefn. As discussed above, the second compare voltage Vrefn includes the DFE coefficient correcting for ISI for the case where the previous bit value is zero. The third input transistor 622 pulls a third current from the first node 642 based on the voltage of the input signal, which pulls the first node 642 low (i.e., lowers vo1). The fourth input transistor 625 pulls a fourth current from the second node 644 based on the second compare voltage Vrefn, which pulls the second node 644 low (i.e., lowers vo2). The voltage on the first node 642 and the voltage on the second node 644 fall at different rates depending on the voltage of the input signal and the first compare voltage Vrefn.

If the voltage of the input signal is greater than the second compare voltage Vrefn, then the third input transistor 622 pulls the first node 642 low at a faster rate than the second node 644. As a result, the voltage vo1 falls faster than the voltage vo2 in this case. When the voltage at the first node 642 drops to a voltage equal to Vdd minus the threshold voltage of the second drive transistor 645, the second drive transistor 645 turns on and pulls the first voltage terminal 666 of the second inverter 660 to Vdd. This causes the second inverter 660 to turn on and output a one since the input 662 was reset low in the reset phase. In this case, the comparator 605 outputs a one at the first output Outp and a zero at the second output Outn.

If, on the other hand, the voltage of the input signal is less than the second compare voltage Vrefn, then the fourth input transistor 625 pulls the second node 644 low at a faster rate than the first node 642. As a result, the voltage vo2 falls faster than the voltage vo1 in this case. When the voltage at the second node 644 falls to a voltage equal to Vdd minus the threshold voltage of the first drive transistor 640, the first drive transistor 640 turns on and pulls the first voltage terminal 656 of the first inverter 650 to Vdd. This causes the first inverter 650 to turn on and output a one since the input 652 was reset low in the reset phase. In this case, the comparator 605 outputs a one at the second output Outn and a zero at the first output Outp.

Thus, the comparator 605 incorporates decision feedback equalization in which first input circuit 610 compares the voltage of the input signal with the first compare voltage Vrefp when the previous bit value is one, and the second input circuit 620 compares the voltage of the input signal with the second compare voltage Vrefn when the previous bit value is zero.

As discussed above, the comparator 605 has a folded topology, which reduces the number of stacked transistors compared with the comparator 505 in FIG. 5. As discussed above, the lower number of stacked transistors allows the comparator 605 to operate at lower supply voltages, which makes the comparator 605 suitable for low-voltage operation. The lower number of stacked transistors also allows the regeneration stage 608 to operate faster and reduce data-dependency effects.

Figure 10:
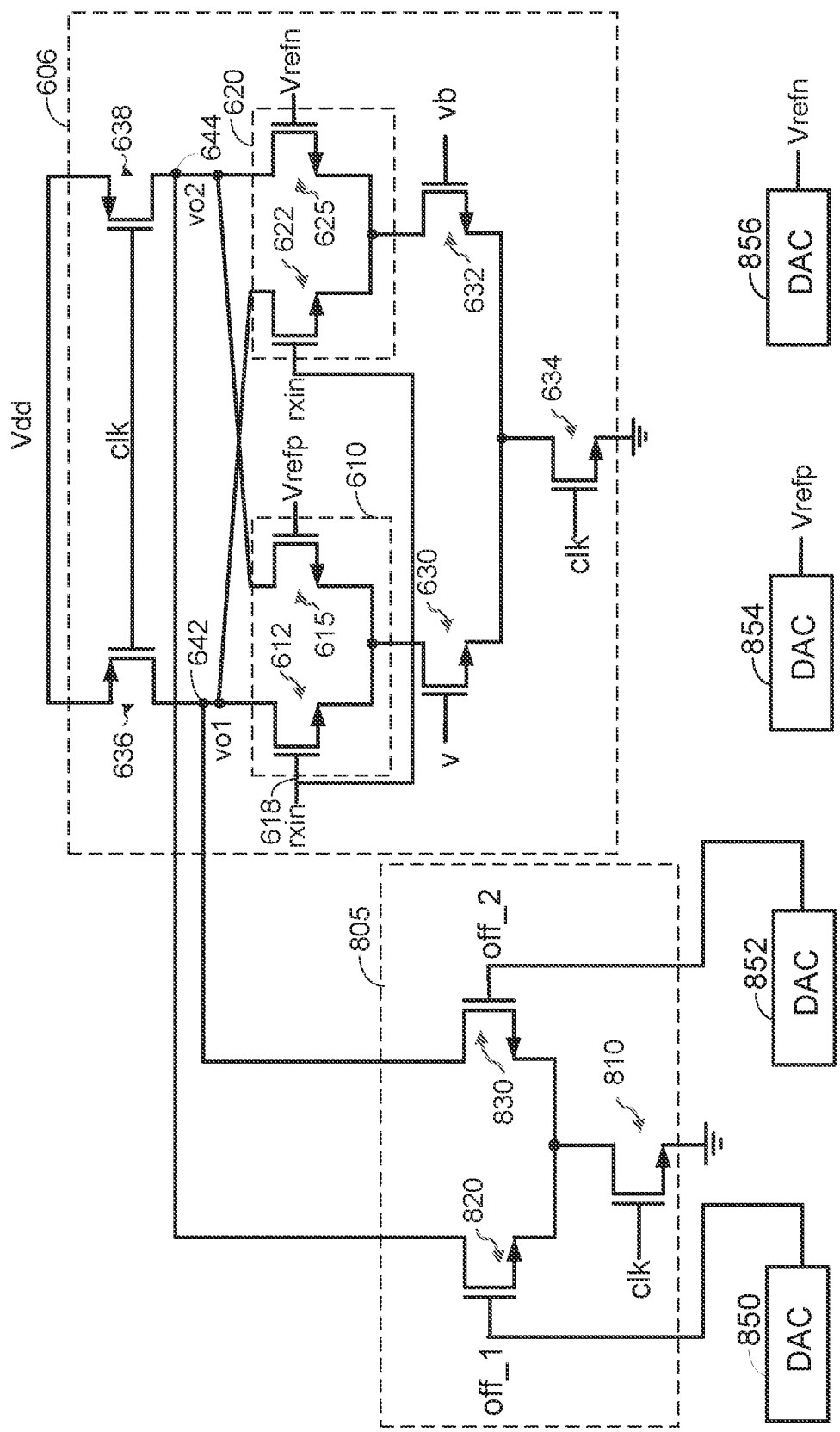
FIG. 10 shows another example of an offset circuit according to certain aspects of the present disclosure.

FIG. 10 shows an example of the offset-cancellation circuit 805 in which each of the switching transistor 810, the first offset transistor 820, and the second offset transistor 830 is implemented with a respective NFET. In this example, the source of the switching transistor 810 is coupled to ground, and the gate of the switching transistor 810 is driven by the clock signal. The source of the first offset transistor 820 is coupled to the drain of the switching transistor 810, the gate of the first offset transistor 820 is coupled to the first offset-cancellation voltage off_1, and the drain of the first offset transistor 820 is coupled to the second node 644. The source of the second offset transistor 830 is coupled to the drain of the switching transistor 810, the gate of the second offset transistor 830 is coupled to the second offset-cancellation voltage off_2, and the drain of the second offset transistor 830 is coupled to the first node 642. As discussed above, the first offset-cancellation voltage off_1 may be provided by the first DAC 850 and the second offset-cancellation voltage off_2 may be provided by the second DAC 852, which allow the first offset-cancellation voltage off_1 and the second offset-cancellation voltage off_2 to be individually programmed using respective digital codes. As discussed above, the offset-cancellation circuit 805 may be used to provide offset voltage cancellation alone or may be used to provide offset voltage cancellation in combination with the offset-cancellation components Voff1 and Voff2 in the first and second compare voltages Vrefp and Vrefn, respectively (e.g., to extend the offset cancellation range and reduce capacitive loading on the intermediate nodes 642 and 644).

Figure 11:
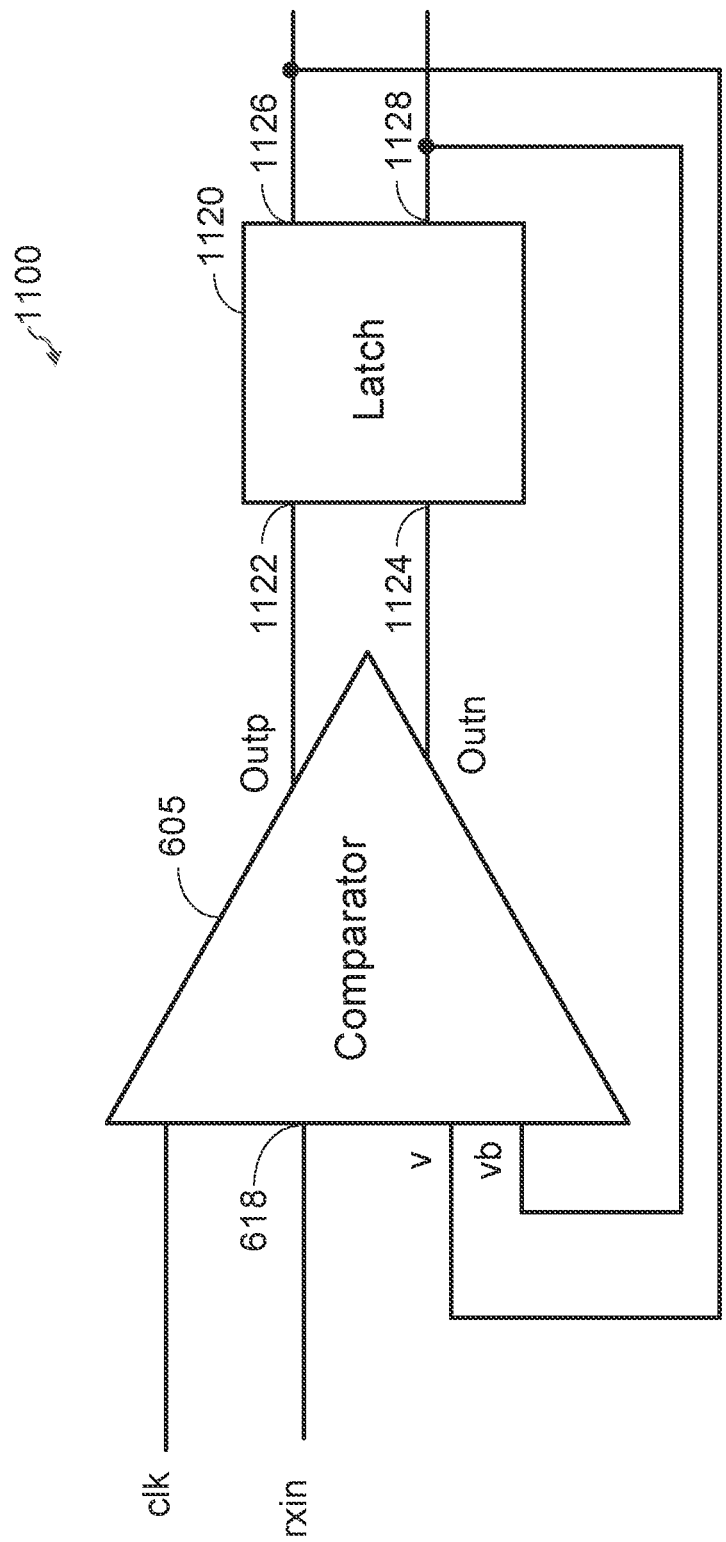
FIG. 11 shows an example of a latch coupled to a comparator according to certain aspects of the present disclosure.

FIG. 11 shows an example of a latch 1120 coupled to the first output Outp and the second output Outn of the comparator 605 according to certain aspects. The comparator 605 may be implemented, for example, with any of the exemplary implementations shown in FIGS. 6 to 10. For ease of illustration, details of the comparator 605 are not explicitly shown in FIG. 11.

The latch 1120 may include a set-reset (SR) latch or another type of latch. The latch 1120 has a first input 1122, a second input 1124, a first output 1126, and a second output 1128. In the example in FIG. 11, the first input 1122 is coupled to the first output Outp of the comparator 605, and the second input 1124 is coupled to the second output Outn of the comparator 605. For the example where the latch 1120 includes an SR latch, the first input 1122 may be a set input and the second input 1124 may be a reset input, or vice versa. The first output 1126 and the second output 1128 may be coupled to a processor (not shown), a deserializer (not shown), a memory, or another type of circuit.

In certain aspects, the latch 1120 may be configured to latch the bit value at the first output Outp of the comparator 605 and latch the complement of the bit value at the second output Outn of the comparator 605. The latch 1120 may also be configured to output the latched bit value at the first output 1126 and output the latched complement of the bit value at the second output 1128, or vice versa. In one example, during the reset phase of a clock period (i.e., period of the clock signal clk), the latch 1120 (e.g., SR latch) is configured to output the latched bit value and the latched complement of bit value from the previous clock period.

In the example shown in FIG. 11, the previous bit value v and the complement of the previous bit value vb used for decision feedback equalization are provided by the first output 1126 and the second output 1128, respectively, of the latch 1120. In this example, the first output 1126 of the latch 1120 may be coupled to the gate of the first switching transistor 630 and the second output 1128 of the latch 1120 may be coupled to the gate of the second switching transistor 632 for the example where each of the switching transistors 630 and 632 is implemented with a respective NFET. The first output 1126 of the latch 1120 may be coupled to the gate of the second switching transistor 632 and the second output 1128 of the latch 1120 may be coupled to the gate of the first switching transistor 630 for the example where each of the switching transistors 630 and 632 is implemented with a respective PFET.

It is to be appreciated that the present disclosure is not limited to the example shown in FIG. 11. For example, in some implementations, the previous bit value v and the complement of the previous bit value vb may be provided by the first output Outp and the second output Outn, respectively, of the comparator 605, or may be provided by internal nodes of the comparator 605. In this example, the first output Outp of the comparator 605 may be coupled to the gate of the first switching transistor 630 and the second output Outn of the comparator 605 may be coupled to the gate of the second switching transistor 632 for the example where each of the switching transistors 630 and 632 is implemented with a respective NFET. The first output Outp of the comparator 605 may be coupled to the gate of the second switching transistor 632 and the second output Outn of the comparator 605 may be coupled to the gate of the first switching transistor 630 for the example where each of the switching transistors 630 and 632 is implemented with a respective PFET.

Figure 12:
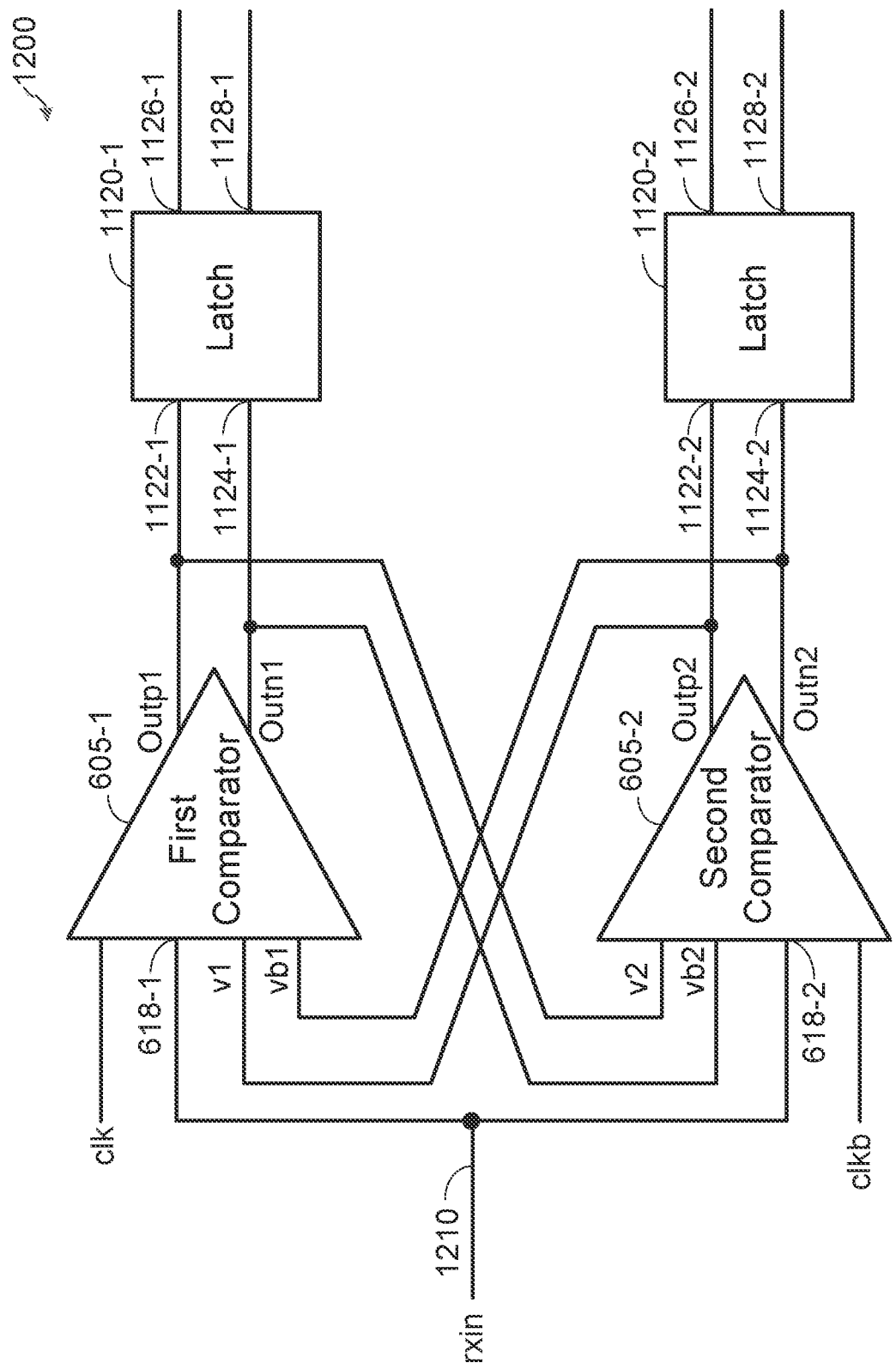
FIG. 12 shows an example of a receiver including time-interleaved comparators according to certain aspects of the present disclosure.

FIG. 12 shows an example of a receiver 1200 having a half-rate architecture according to certain aspects. The receiver 1200 includes a first comparator 605-1, a second comparator 605-2, a first latch 1120-1, and a second latch 1120-2. Each of the first comparator 605-1 and the second comparator 605-2 may be a separate instance of the comparator 605 and may be implemented, for example, with any of the exemplary implementations shown in FIGS. 6 to 10. In the example in FIG. 12, the reference numbers for the elements of the first comparator 605-1 are appended with the numerical suffix "1" and the reference numbers for the elements of the second comparator 605-2 are appended with the numerical suffix "2".

The input 618-1 of the first comparator 605-1 and the input 618-2 of the second comparator 605-2 are coupled to an input 1210 of the receiver 1200. The input 1210 is configured to receive a data signal. For example, the input 1210 may be coupled to the link 130 and configured to receive the data signal from the transmitter 112 (shown in FIG. 2) via the link 130.

In this example, the first comparator 605-1 receives the clock signal clk, and the second comparator 605-1 receives the complementary clock signal clkb (i.e., the complement of the clock signal clk). Thus, the clock signal clk drives the gates of the respective switching transistors 634-1, 636-1, and 638-1 (not shown in FIG. 12) of the first comparator 605-1, and the complementary clock signal clkb drives the gates of the respective switching transistors 634-2, 636-2, and 638-2 (not shown in FIG. 12) of the second comparator 605-2. This causes the first comparator 605-1 and the second comparator 605-2 to alternately resolve the bits of the data signal received at the input 1210. In other words, the first comparator 605-1 and the second comparator 605-2 resolve the bits of the data signal in a time-interleaved fashion. For example, the first comparator 605-1 may resolve even bits of the data signal and the second comparator 605-2 may resolve odd bits or the data signal, or vice versa.

In the example in FIG. 12, the first latch 1120-1 (e.g., first SR latch) has a first input 1122-1 coupled to the first output Outp1 of the first comparator 605-1, a second input 1124-1 coupled to the second output Outn1 of the first comparator 605-1, a first output 1126-1, and a second output 1128-1. The first output 1126-1 and the second output 1128-1 may be coupled to a processor (not shown), a deserializer (not shown), a memory, or another type of circuit. The first latch 1120-1 may be configured to latch the bit value at the first output Outp1 of the first comparator 605-1 and latch the complement of the bit value at the second output Outn1 of the first comparator 605-1. The first latch 1120-1 may also be configured to output the latched bit value at the first output 1126-1 and output the latched complement of the bit value at the second output 1128-1, or vice versa.

The second latch 1120-2 (e.g., second SR latch) has a first input 1122-2 coupled to the first output Outp2 of the second comparator 605-2, a second input 1124-2 coupled to the second output Outn2 of the second comparator 605-2, a first output 1126-2, and a second output 1128-2. The first output 1126-2 and the second output 1128-2 may be coupled to a processor (not shown), a deserializer (not shown), a memory, or another type of circuit. The second latch 1120-2 may be configured to latch the bit value at the first output Outp2 of the second comparator 605-2 and latch the complement of the bit value at the second output Outn2 of the second comparator 605-2. The second latch 1120-2 may also be configured to output the latched bit value at the first output 1126-2 and output the latched complement of the bit value at the second output 1128-2, or vice versa.

In the example shown in FIG. 12, the previous bit value v1 and the complement of the previous bit value vb1 used for decision feedback equalization in the first comparator 605-1 are provided by the first output Outp2 and the second output Outn2, respectively, of the second comparator 605-2. In this example, the first output Outp2 may be coupled to the gate of the respective first switching transistor 630-1 of the first comparator 605-1 and the second output Outp2 may be coupled to the gate of the respective second switching transistor 632-1 of the first comparator 605-1 for the example where each of the switching transistors 630-1 and 632-1 is implemented with a respective NFET. The first output Outp2 may be coupled to the gate of the respective second switching transistor 632-1 of the first comparator 605-1 and the second output Outn2 may be coupled to the gate of the respective first switching transistor 630-1 of the first comparator 605-1 for the example where each of the switching transistors 630-1 and 632-1 is implemented with a respective PFET. It is to be appreciated that, in other implementations, the previous bit value v1 and the complement of the previous bit value vb1 may be provided by a first internal node and a second internal node, respectively, of the second comparator 605-2, or the previous bit value v1 and the complement of the previous bit value vb1 may be provided by the first output 1126-2 and the second output 1128-2, respectively, of the second latch 1120-2.

In the example shown in FIG. 12, the previous bit value v2 and the complement of the previous bit value vb2 used for decision feedback equalization in the second comparator 605-2 are provided by the first output Outp1 and the second output Outn1, respectively, of the first comparator 605-1. In this example, the first output Outp1 may be coupled to the gate of the respective first switching transistor 630-2 of the second comparator 605-2 and the second output Outp1 may be coupled to the gate of the respective second switching transistor 632-2 of the second comparator 605-2 for the example where each of the switching transistors 630-2 and 632-2 is implemented with a respective NFET. The first output Outp1 may be coupled to the gate of the respective second switching transistor 632-2 of the second comparator 605-2 and the second output Outn1 may be coupled to the gate of the respective first switching transistor 630-2 of the second comparator 605-2 for the example where each of the switching transistors 630-2 and 632-2 is implemented with a respective PFET. It is to be appreciated that, in other implementations, the previous bit value v2 and the complement of the previous bit value vb2 may be provided by a first internal node and a second internal node, respectively, of the first comparator 605-1, or the previous bit value v2 and the complement of the previous bit value vb2 may be provided by the first output 1126-1 and the second output 1128-1, respectively, of the first latch 1120-1.

Figure 13:
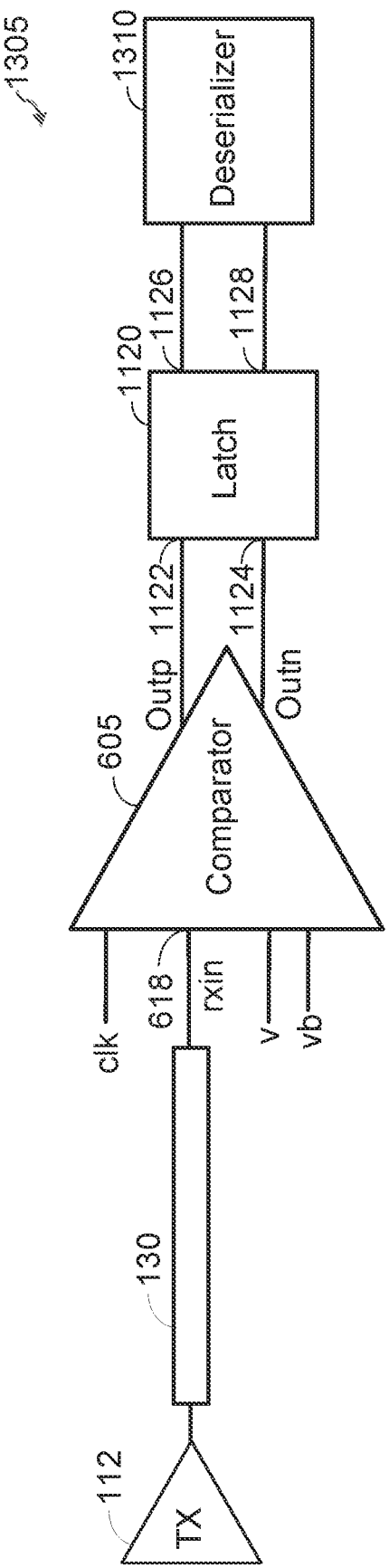
FIG. 13 shows an example of a system including a comparator and a deserializer according to certain aspects of the present disclosure.

FIG. 13 shows an example of a system 1305 including the comparator 605 and the latch 1120 according to certain aspects of the present disclosure. In this example, the system 1305 also includes the transmitter 112 and the link 130 (e.g., a serial link) discussed above with reference to FIG. 1. As shown in FIG. 13, the input 618 of the comparator 605 is coupled to the output of the transmitter 112 via the link 130, and therefore receives the input signal rxin via the link 130 in this example. The comparator 605 may receive the previous bit value v and the complement of the previous bit value vb from the latch 1120 (shown in FIG. 11). In another example, the comparator 605 may receive the previous hit value v and the complement of the previous bit value vb from another comparator that is time-interleaved with the comparator 605. In this example, the comparator 605 may correspond to the first comparator 605-1 and the other comparator may correspond to the second comparator 605-2 shown in FIG. 12, or vice versa.

The system 1305 also includes a deserializer 1310 coupled to the latch 1120 (e.g., to support SerDes communication). The deserializer 1310 may be coupled to the first output 1126 and/or the second output 1128 of the latch 1120. In this example, deserializer 1310 may be configured to receive a serial bit stream from the latch 1120 and convert the serial bit stream into multiple parallel bit streams. The parallel bit steams may be sent to a processor (not shown) for further processing.

Figure 14:
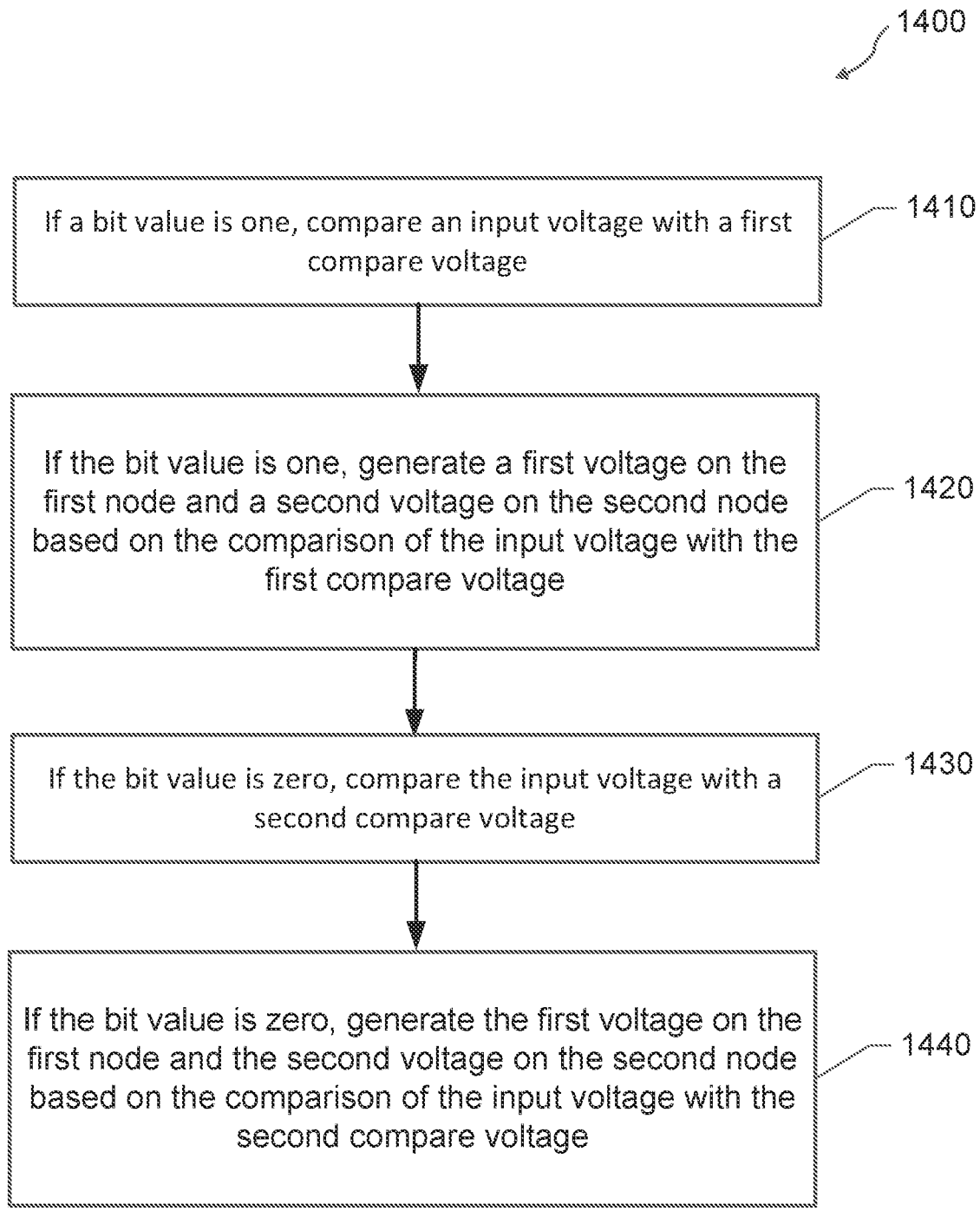
FIG. 14 is a flowchart illustrating a method of operating a comparator according to certain aspects of the present disclosure.

FIG. 14 illustrates an example of a method of operating a comparator (e.g., comparator 605) according to certain aspects of the present disclosure. The comparator includes an input stage (e.g., input stage 606) and a regeneration stage (e.g., regeneration stage 608). The regeneration stage includes a first inverter (e.g., first inverter 650), a second inverter (e.g., second inverter 660) cross-coupled with the first inverter, a first drive transistor (e.g., first drive transistor 640) coupled to the first inverter, and a second drive transistor (e.g., second drive transistor 645) coupled to the second inverter, wherein a gate of the second drive transistor is coupled to a first node (e.g., first node 642) of the input stage (e.g., input stage 606), and a gate of the first drive transistor is coupled to a second node (e.g., second node 644) of the input stage (e.g., input stage 606).

At block 1410, if a previous bit value is one, an input voltage is compared with a first compare voltage. The previous bit value may correspond to the previous bit value v, the input voltage may correspond to the voltage of the input signal, and the first compare voltage may correspond to the first compare voltage Vrefp. The comparison may be performed by the first input circuit 610.

At block 1420, if the previous bit value is one, a first voltage is generated on the first node and a second voltage is generated on the second node based on the comparison of the input voltage with the first compare voltage. The first voltage may correspond to voltage vo1 and the second voltage may correspond to voltage vo2. The voltage generation may be performed by the first input circuit 610.

At block 1430, if the previous bit value is zero, the input voltage is compared with a second compare voltage. The input voltage may correspond to the voltage of the input signal, and the second compare voltage may correspond to the second compare voltage Vrefn. The comparison may be performed by the second input circuit 620.

At block 1440, if the previous bit is zero, the first voltage is generated on the first node and the second voltage is generated on the second node based on the comparison of the input voltage with the second compare voltage. The voltage generation may be performed by the second input circuit 620.

In certain aspects, the first compare voltage includes a reference voltage (e.g., Vref), a first decision feedback equalizer (DFE) coefficient (e.g., Vdce1), and a first offset-cancellation component (e.g., Voff1). The first DFE coefficient may correct for ISI for the case where the previous bit value is one. The second compare voltage includes the reference voltage, a second DFE coefficient (e.g., Vdce2), and a second offset-cancellation component (e.g., Voff2). The second DFE coefficient may correct for ISI for the case where the previous bit value is zero. In certain aspects, the first compare voltage and the second compare voltage may be generated by the third DAC 854 and the fourth DAC 856, respectively.

In certain aspects, the comparator further includes a first offset transistor (e.g., first offset transistor 820) coupled to the second node, and a second offset transistor (e.g., second offset transistor 830) coupled to the first node. In these aspects, the method 1400 may also include inputting a first offset-cancellation voltage (e.g., off_1) to a gate of the first offset transistor, and inputting a second offset-cancelation voltage (e.g., off2) to a gate of the second offset transistor. The first offset-cancellation voltage may be input to the gate of the first offset transistor by the first DAC 850 and the second offset cancelation voltage may be input to the gate of the second offset transistor by the second DAC 852.

In certain aspects, the comparator further includes a first input transistor (e.g., first input transistor 612) coupled to the first node and a second input transistor (e.g., second input transistor 615) coupled to the second node. In these aspects, comparing the input voltage with the first compare voltage comprises inputting the input voltage to a gate of the first input transistor and inputting the first compare voltage to a gate of the second input transistor. The input voltage may be input to the gate of the first input transistor via the input 618 of the comparator 605, and the first compare voltage may be input to the gate of the second input transistor by the third DAC 854.

In certain aspects, the comparator further includes a third input transistor (e.g., third input transistor 622) coupled to the first node and a fourth input transistor (e.g., fourth input transistor 625) coupled to the second node. In these aspects, comparing the input voltage with the second compare voltage comprises inputting the input voltage to a gate of the third input transistor and inputting the second compare voltage to a gate of the fourth input transistor. The input voltage may be input to the gate of the third input transistor via the input 618 of the comparator 605, and the second compare voltage may be input to the gate of the fourth input transistor by the fourth DAC 856.

In certain aspects, the previous bit value is based on a previous bit decision by the comparator. In certain aspects, the hit value is based on a previous hit decision by another comparator that is time-interleaved with the comparator. For example, the comparator may correspond to the first comparator 605-1 and the other comparator may correspond to the second comparator 605-2 shown in FIG. 12, or vice versa.

Implementation examples are described in the following numbered clauses:

1. A comparator, comprising:
    an input stage, comprising:
        a first input circuit coupled to a first node and a second node;
        a first switching transistor configured to enable the first input circuit if a previous bit value is one;
        a second input circuit coupled to the first node and the second node; and
        a second switching transistor configured to enable the second input circuit if the previous hit value is zero; and
    a regeneration stage, comprising:
        a first inverter;
        a second inverter cross coupled with the first inverter;
        a first drive transistor coupled to the first inverter, wherein a gate of the first drive transistor is coupled to the second node; and
        a second drive transistor coupled to the second inverter, wherein a gate of the second drive transistor is coupled to the first node.
2. The comparator of clause 1, wherein the input stage and the regeneration stage are arranged in parallel between a supply rail and a ground.
3. The comparator of clause 1 or 2, wherein the first input circuit comprises:
    a first input transistor, wherein a source of the first input transistor is coupled to the first switching transistor, a gate of the first input transistor is coupled to an input of the comparator, and a drain of the first input transistor is coupled to the first node; and
    a second input transistor, wherein a source of the second input transistor is coupled to the first switching transistor, a gate of the second input transistor is configured to receive a first compare voltage, and a drain of the second input transistor is coupled to the second node.
4. The comparator of clause 3, wherein the first input transistor comprises a first p-type field effect transistor (PFET), and the second input transistor comprises a second PFET.
5. The comparator of clause 4, wherein:
    the first drive transistor comprises a first n-type field effect transistor (NFET), wherein a drain of the first NFET is coupled to the first inverter, and a source of the first NFET is coupled to a ground; and the second drive transistor comprises a second NFET, wherein a drain of the second NFET is coupled to the second inverter, and a source of the second NFET is coupled to the ground.
6. The comparator of clause 3, wherein the first input transistor comprises a first n-type field effect transistor (NFET), and the second input transistor comprises a second NFET.
7. The comparator of clause 6, wherein:
    the first drive transistor comprises a first p-type field effect transistor (PFET), wherein a drain of the first PFET is coupled to the first inverter, and a source of the first PFET is coupled to a supply rail; and
    the second drive transistor comprises a second PFET, wherein a drain of the second PFET is coupled to the second inverter, and a source of the second PFET is coupled to the supply rail.
8. The comparator of any one of clauses 3 to 7, wherein the gate of the second input transistor is coupled to a digital-to-analog converter (DAC), wherein the DAC is configured to generate the first compare voltage.
9. The comparator of any one of clauses 3 to 8, wherein the second input circuit comprises:
    a third input transistor, wherein a source of the third input transistor is coupled to the second switching transistor, a gate of the third input transistor is coupled to the input of the comparator, and a drain of the third input transistor is coupled to the first node; and
    a fourth input transistor, wherein a source of the fourth input transistor is coupled to the second switching transistor, a gate of the fourth input transistor is configured to receive a second compare voltage, and a drain of the fourth input transistor is coupled to the second node.
10. The comparator of 9, wherein:
    the gate of the second input transistor is coupled to a first digital-to-analog converter (DAC), wherein the first DAC is configured to generate the first compare voltage; and
    the gate of the fourth input transistor is coupled to a second DAC, wherein the second DAC is configured to generate the second compare voltage.
11. The comparator of clause 9 or 10, wherein:
    the first compare voltage includes a reference voltage, a first decision feedback equalizer (DFE) coefficient, and a first offset-cancellation component; and
    the second compare voltage includes the reference voltage, a second DFE coefficient, and a second offset-cancellation component.
12. The comparator of clause 1, further comprising an offset-cancellation circuit, wherein the offset-cancellation circuit comprises:
    a first offset transistor coupled to the second node, wherein a gate of the first offset transistor is configured to receive a first offset-cancellation voltage; and
    a second offset transistor coupled to the first node, wherein a gate of the second offset transistor is configured to receive a second offset-cancellation voltage.
13. The comparator of anyone of clauses 1 to 12, further comprising an offset-cancellation circuit, wherein the offset-cancellation circuit comprises:
    a first offset transistor coupled to the second node, wherein a gate of the first offset transistor is configured to receive a first offset-cancellation voltage; and
    a second offset transistor coupled to the first node, wherein a gate of the second offset transistor is configured to receive a second offset-cancellation voltage.

14. The comparator of clause 13, wherein:
the gate of the first offset transistor is coupled to a first digital-to-analog converter (DAC), wherein the first DAC is configured to generate the first offset-cancellation voltage; and
the gate of the second offset transistor is coupled to a second DAC, wherein the second DAC is configured to generate the second offset-cancellation voltage.

15. The comparator of any one of clauses 1 to 14, further comprising a third switching transistor coupled between the first switching transistor and a ground and coupled between the second switching transistor and the ground, wherein a gate of the third switching transistor is configured to receive a clock signal.

16. The comparator of clause 15, further comprising:
a fourth switching transistor coupled between the first node and a supply rail, wherein a gate of the fourth switching transistor is configured to receive the clock signal; and
a fifth switching transistor coupled between the second node and the supply rail, wherein a gate of the fifth switching transistor is configured to receive the clock signal.

17. The comparator of any one of clauses 1 to 14, further comprising a third switching transistor coupled between the first switching transistor and a supply rail and coupled between the second switching transistor and the supply rail, wherein a gate of the third switching transistor is configured to receive a clock signal.

18. The comparator of clause 17, further comprising:
a fourth switching transistor coupled between the first node and a ground, wherein a gate of the fourth switching transistor is configured to receive the clock signal; and
a fifth switching transistor coupled between the second node and the ground, wherein a gate of the fifth switching transistor is configured to receive the clock signal.

19. The comparator of any one of clauses 1 to 18, wherein the previous bit value is based on a previous bit decision by the comparator.

20. The comparator of any one of clauses 1 to 18, wherein the previous bit value is based on a previous bit decision by another comparator that is time-interleaved with the comparator.

21. The comparator of clause 20, wherein:
a gate of the first switching transistor is coupled to a first output or a first internal node of the other comparator; and
a gate of the second switching transistor is coupled to a second output or a second internal node of the other comparator.

22. A method of operating a comparator, the comparator including an input stage and a regeneration stage, wherein the regeneration stage includes first inverter, a second inverter cross-coupled with the first inverter, a first drive transistor coupled to the first inverter, and a second drive transistor coupled to the second inverter, wherein a gate of the second drive transistor is coupled to a first node of the input stage, and a gate of the first drive transistor is coupled to a second node of the input stage, the method comprising:
if a previous bit value is one,
comparing an input voltage with a first compare voltage; and
generating a first voltage on the first node and a second voltage on the second node based on the comparison of the input voltage with the first compare voltage; and if the previous bit value is zero,
comparing the input voltage with a second compare voltage; and
generating the first voltage on the first node and the second voltage on the second node based on the comparison of the input voltage with the second compare voltage.

23. The method of clause 22, wherein:
the first compare voltage includes a reference voltage, a first decision feedback equalizer (DFE) coefficient, and a first offset-cancellation component; and
the second compare voltage includes the reference voltage, a second DFE coefficient, and a second offset-cancellation component.

24. The method of clause 22, wherein the comparator further includes a first offset transistor coupled to the second node, and a second offset transistor coupled to the first node, and the method further comprises:
inputting a first offset-cancellation voltage to a gate of the first offset transistor; and
inputting a second offset-cancelation voltage to a gate of the second offset transistor.

25. The method of clause 24, wherein:
the first compare voltage includes a reference voltage, a first decision feedback equalizer (DFE) coefficient, and a first offset-cancellation component; and
the second compare voltage includes the reference voltage, a second DFE coefficient, and a second offset-cancellation component.

26. The method of any one of clauses 22 to 25, wherein:
the comparator further includes a first input transistor coupled to the first node and a second input transistor coupled to the second node, and
comparing the input voltage with the first compare voltage comprises inputting the input voltage to a gate of the first input transistor and inputting the first compare voltage to a gate of the second input transistor.

27. The method of clause 26, wherein each of the first input transistor and the second input transistor includes a respective p-type field effect transistor (PFET) and each of the first drive transistor and the second drive transistor includes a respective n-type field effect transistor (NFET).

28. The method of clause 26, wherein each of the first input transistor and the second input transistor includes a respective n-type field effect transistor (NFET) and each of the first drive transistor and the second drive transistor includes a respective p-type field effect transistor (PFET).

29. The method of any one of clauses 26 to 28, wherein:
the comparator further includes a third input transistor coupled to the first node and a fourth input transistor coupled to the second node, and
comparing the input voltage with the second compare voltage comprises inputting the input voltage to a gate of the third input transistor and inputting the second compare voltage to a gate of the fourth input transistor.

30. The method of any one of clauses 22 to 29, wherein the previous bit value is based on a previous bit decision by the comparator.

31. The method of any one of clauses 22 to 29, wherein the previous bit value is based on a previous bit decision by another comparator that is time-interleaved with the comparator.

32. A system, comprising:
a comparator comprising:
an input stage, comprising:
a first input circuit coupled to a first node and a second node;

a first switching transistor configured to enable the first input circuit if a previous bit value is one;

a second input circuit coupled to the first node and the second node; and a second switching transistor configured to enable the second input circuit if the previous bit value is zero; and a regeneration stage, comprising:

a first inverter;

a second inverter cross coupled with the first inverter, wherein a first output of the comparator is coupled to an output of the second inverter and a second output of the comparator is coupled to an output of the first inverter;

a first drive transistor coupled to the first inverter, wherein a gate of the first drive transistor is coupled to the second node; and a second drive transistor coupled to the second inverter, wherein a gate of the second drive transistor is coupled to the first node; and a latch having a first input and a second input, wherein the first input of the latch is coupled to the first output of the comparator, and the second input of the latch is coupled to the second output of the comparator.

33. The system of clause 32, wherein the input stage and the regeneration stage are arranged in parallel between a supply rail and a ground.

34. The system of clause 32 or 33, wherein the first input circuit comprises:

a first input transistor, wherein a source of the first input transistor is coupled to the first switching transistor, a gate of the first input transistor is coupled to an input of the comparator, and a drain of the first input transistor is coupled to the first node; and a second input transistor, wherein a source of the second input transistor is coupled to the first switching transistor, a gate of the second input transistor is configured to receive a first compare voltage, and a drain of the second input transistor is coupled to the second node.

35. The system of clause 34, wherein the second input circuit comprises:

a third input transistor, wherein a source of the third input transistor is coupled to the second switching transistor, a gate of the third input transistor is coupled to the input of the comparator, and a drain of the third input transistor is coupled to the first node; and a fourth input transistor, wherein a source of the fourth input transistor is coupled to the second switching transistor, a gate of the fourth input transistor is configured to receive a second compare voltage, and a drain of the fourth input transistor is coupled to the second node.

36. The system of clause 34 or 35, further comprising:

a transmitter having an output; and a link coupled between the output of the transmitter and the input of the comparator.

37. The system of any one of clauses 32 to 36, wherein the latch comprises a set-reset (SR) latch.

38. The system of any one of clauses 32 to 37, further comprising a deserializer coupled to the latch.

In clause 1, the first drive transistor and the second drive transistor allow the comparator to have a folded topology by coupling the first node of the input stage to the gate of the second drive transistor and coupling the second node of the input stage to the gate of the first drive transistor. This allows the input stage to affect the cross-coupled first inverter and second inverter of the regeneration stage through the first drive transistor and the second drive transistor without having to stack the input stage with the regeneration stage, as is the case for the comparator 505 in FIG. 5. As discussed above, the folded topology lowers the number of stacked transistors which allows the comparator to operate at lower supply voltages for low-voltage operation and allows the regeneration stage to operate faster.

The first offset-cancellation component and the second offset-cancellation component recited in clause 11 in combination with the first offset transistor and the second offset transistor recited in clause 12 allows the comparator to achieve a given offset-cancellation range using smaller sizes for the first offset transistor and the second offset transistor compared with a comparator only using the first offset transistor and the second offset transistor for offset cancellation. This is because the first offset-cancellation component and the second offset-cancellation component contribute to the overall offset-cancellation range of the comparator. The smaller sizes of the first offset transistor and the second offset transistor reduce capacitive loading on the first node and the second node, which increases the speed of the comparator.

The method of clause 22 allows the comparator to have a folded topology by generating the first voltage on the first node of the input stage and generating the second voltage on the second node of the input stage based on the comparison of the input voltage with the first compare voltage or the comparison of the input voltage with the second compare voltage, wherein the gate of the second drive transistor is coupled to the first node of the input stage, and the gate of the first drive transistor is coupled to the second node of the input stage. This allows the input stage to affect the cross-coupled first inverter and second inverter of the regeneration stage through the first drive transistor and the second drive transistor without having to stack the input stage with the regeneration stage, as is the case for the comparator 505 in FIG. 5. As discussed above, the folded topology lowers the number of stacked transistors which allows the comparator to operate at lower supply voltages for low-voltage operation and allows the regeneration stage to operate faster.

The first offset-cancellation component and the second offset-cancellation component recited in clause 23 in combination with the first offset transistor and the second offset transistor recited in clause 24 allows the comparator to achieve a given offset-cancellation range using smaller sizes for the first offset transistor and the second offset transistor compared with a comparator only using the first offset transistor and the second offset transistor for offset cancellation. This is because the first offset-cancellation component and the second offset-cancellation component contribute to the overall offset-cancellation range. The smaller sizes of the first offset transistor and the second offset transistor reduce capacitive loading on the first node and the second node, which increases the speed of the comparator.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

As used herein, a first inverter and a second inverter are "cross coupled" when the input of the first inverter is coupled to the output of the second inverter and the output of the second inverter is coupled to the input of the first inverter. As used herein, two comparators are "time-interleaved" when the comparators alternate between making bit decisions on a data signal. As used herein, "previous bit decision" is a bit decision previously made by a comparator (e.g., the comparator 605 in FIG. 11 or any one of the first and second comparators 605-1 and 605-2 in FIG. 12).

It is to be appreciated that offset cancellation may cancel all of or a portion of an offset voltage to reduce the effects of the offset voltage.

It is to be appreciated that an n-type field effect transistor may also be referred to as an n-channel field effect transistor and a p-type field effect transistor may also be referred to as a p-channel field effect transistor.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A comparator, comprising:
    an input stage, comprising:
        a first input circuit coupled to a first node and a second node, the first input circuit configured to receive an input of the comparator and a first compare voltage including a first offset-cancellation component;
        a first switching transistor configured to enable the first input circuit if a previous bit value is one;
        a second input circuit coupled to the first node and the second node, the second input circuit configured to receive the input of the comparator and a second compare voltage including a second offset-cancellation component, wherein the first offset-cancellation component and the second offset-cancellation component contribute to cancellation of an offset voltage of the comparator; and
        a second switching transistor configured to enable the second input circuit if the previous bit value is zero;
    a regeneration stage, comprising:
        a first inverter;
        a second inverter cross coupled with the first inverter;
        a first drive transistor coupled to the first inverter, wherein a gate of the first drive transistor is coupled to the second node; and
        a second drive transistor coupled to the second inverter, wherein a gate of the second drive transistor is coupled to the first node; and
    an offset cancellation circuit, comprising:
        a first offset transistor coupled to the second node, wherein a gate of the first offset transistor is configured to receive a first offset-cancellation voltage; and
        a second offset transistor coupled to the first node, wherein a gate of the second offset transistor is configured to receive a second offset-cancellation voltage, and the offset cancellation circuit contributes to the cancellation of the offset voltage of the comparator.

2. The comparator of claim 1, wherein the input stage and the regeneration stage are arranged in parallel between a supply rail and a ground.

3. The comparator of claim 1, wherein the first input circuit comprises:
    a first input transistor, wherein a source of the first input transistor is coupled to the first switching transistor, a gate of the first input transistor is coupled to the input of the comparator, and a drain of the first input transistor is coupled to the first node; and
    a second input transistor, wherein a source of the second input transistor is coupled to the first switching transistor, a gate of the second input transistor is configured to receive the first compare voltage, and a drain of the second input transistor is coupled to the second node.

4. The comparator of claim 3, wherein the first input transistor comprises a first p-type field effect transistor (PFET), and the second input transistor comprises a second PFET.

5. The comparator of claim 4, wherein:
    the first drive transistor comprises a first n-type field effect transistor (NFET), wherein a drain of the first NFET is coupled to the first inverter, and a source of the first NFET is coupled to a ground; and
    the second drive transistor comprises a second NFET, wherein a drain of the second NFET is coupled to the second inverter, and a source of the second NFET is coupled to the ground.

6. The comparator of claim 3, wherein the first input transistor comprises a first n-type field effect transistor (NFET), and the second input transistor comprises a second NFET.

7. The comparator of claim 6, wherein:
    the first drive transistor comprises a first p-type field effect transistor (PFET), wherein a drain of the first PFET is coupled to the first inverter, and a source of the first PFET is coupled to a supply rail; and
    the second drive transistor comprises a second PFET, wherein a drain of the second PFET is coupled to the second inverter, and a source of the second PFET is coupled to the supply rail.

8. The comparator of claim 3, wherein the gate of the second input transistor is coupled to a digital-to-analog converter (DAC), wherein the DAC is configured to generate the first compare voltage.

9. The comparator of claim 3, wherein the second input circuit comprises:
    a third input transistor, wherein a source of the third input transistor is coupled to the second switching transistor, a gate of the third input transistor is coupled to the input of the comparator, and a drain of the third input transistor is coupled to the first node; and
    a fourth input transistor, wherein a source of the fourth input transistor is coupled to the second switching transistor, a gate of the fourth input transistor is configured to receive the second compare voltage, and a drain of the fourth input transistor is coupled to the second node.

10. The comparator of claim 9, wherein:
    the gate of the second input transistor is coupled to a first digital-to-analog converter (DAC), wherein the first DAC is configured to generate the first compare voltage; and the gate of the fourth input transistor is coupled to a second DAC, wherein the second DAC is configured to generate the second compare voltage.

11. The comparator of claim 9, wherein:
the first compare voltage includes a reference voltage and a first decision feedback equalizer (DFE) coefficient; and
the second compare voltage includes the reference voltage and a second DFE coefficient.

12. The comparator of claim 1, wherein:
the gate of the first offset transistor is coupled to a first digital-to-analog converter (DAC), wherein the first DAC is configured to generate the first offset-cancellation voltage; and
the gate of the second offset transistor is coupled to a second DAC, wherein the second DAC is configured to generate the second offset-cancellation voltage.

13. The comparator of claim 1, further comprising a third switching transistor coupled between the first switching transistor and a ground and coupled between the second switching transistor and the ground, wherein a gate of the third switching transistor is configured to receive a clock signal.

14. The comparator of claim 1, further comprising:
a fourth switching transistor coupled between the first node and a supply rail, wherein a gate of the fourth switching transistor is configured to receive the clock signal; and
a fifth switching transistor coupled between the second node and the supply rail, wherein a gate of the fifth switching transistor is configured to receive the clock signal.

15. The comparator of claim 1, further comprising a third switching transistor coupled between the first switching transistor and a supply rail and coupled between the second switching transistor and the supply rail, wherein a gate of the third switching transistor is configured to receive a clock signal.

16. The comparator of claim 15, further comprising:
a fourth switching transistor coupled between the first node and a ground, wherein a gate of the fourth switching transistor is configured to receive the clock signal; and
a fifth switching transistor coupled between the second node and the ground, wherein a gate of the fifth switching transistor is configured to receive the clock signal.

17. The comparator of claim 1, wherein the previous bit value is based on a previous bit decision by the comparator.

18. The comparator of claim 1, wherein the previous bit value is based on a previous bit decision by another comparator that is time-interleaved with the comparator.

19. The comparator of claim 18, wherein:
a gate of the first switching transistor is coupled to a first output or a first internal node of the other comparator; and
a gate of the second switching transistor is coupled to a second output or a second internal node of the other comparator.

20. A method of operating a comparator, the comparator including a first inverter, a second inverter cross-coupled with the first inverter, a first drive transistor coupled to the first inverter, and a second drive transistor coupled to the second inverter, wherein a gate of the second drive transistor is coupled to a first node, and a gate of the first drive transistor is coupled to a second node, further wherein the comparator further includes a first offset transistor coupled to the second node, and a second offset transistor coupled to the first node, the method comprising:
if a previous bit value is one,
comparing an input voltage with a first compare voltage using a first input circuit, the first compare voltage including a first offset-cancellation component, and
generating a first voltage on the first node and a second voltage on the second node based on the comparison of the input voltage with the first compare voltage;
if the previous bit value is zero,
comparing the input voltage with a second compare voltage using a second input circuit, the second compare signal including a second offset-cancellation component, wherein the first offset-cancellation component and the second offset-cancellation component contribute to cancellation of an offset voltage of the comparator, and
generating the first voltage on the first node and the second voltage on the second node based on the comparison of the input voltage with the second compare voltage;
using a first digital-to-analog converter (DAC) to generate a first offset-cancellation voltage;
inputting the first offset-cancellation voltage to a gate of the first offset transistor;
using a second digital-to-analog converter (DAC) to generate a second offset-cancellation voltage; and
inputting the second offset-cancelation voltage to a gate of the second offset transistor, wherein the first offset-cancellation voltage and the second offset-cancellation voltage contribute to the cancellation of the offset voltage of the comparator.

21. The method of claim 20, wherein:
the first compare voltage includes a reference voltage and a first decision feedback equalizer (DFE) coefficient; and
the second compare voltage includes the reference voltage and a second DFE coefficient.

22. The method of claim 20, wherein:
the comparator further includes a first input transistor coupled to the first node and a second input transistor coupled to the second node, and
comparing the input voltage with the first compare voltage comprises inputting the input voltage to a gate of the first input transistor and inputting the first compare voltage to a gate of the second input transistor.

23. The method of claim 22, wherein each of the first input transistor and the second input transistor includes a respective p-type field effect transistor (PFET) and each of the first drive transistor and the second drive transistor includes a respective n-type field effect transistor (NFET).

24. The method of claim 22, wherein each of the first input transistor and the second input transistor includes a respective n-type field effect transistor (NFET) and each of the first drive transistor and the second drive transistor includes a respective p-type field effect transistor (PFET).

25. The method of claim 22, wherein:
the comparator further includes a third input transistor coupled to the first node and a fourth input transistor coupled to the second node, and
comparing the input voltage with the second compare voltage comprises inputting the input voltage to a gate of the third input transistor and inputting the second compare voltage to a gate of the fourth input transistor.

26. The method of claim 20, wherein the previous bit value is based on a previous bit decision by the comparator.

27. The method of claim 20, wherein the previous bit value is based on a previous bit decision by another comparator that is time-interleaved with the comparator.

28. A system, comprising:
a comparator comprising:
an input stage, comprising:
a first input circuit coupled to a first node and a second node, the first input circuit configured to receive an input of the comparator and a first compare voltage including a first offset-cancellation component;
a first switching transistor configured to enable the first input circuit if a previous bit value is one;
a second input circuit coupled to the first node and the second node, the second input circuit configured to receive an input of the comparator and a second compare voltage including a second offset-cancellation component, component, wherein the first offset-cancellation component and the second offset-cancellation component contribute to cancellation of an offset voltage of the comparator; and
a second switching transistor configured to enable the second input circuit if the previous bit value is zero;
a regeneration stage, comprising:
a first inverter;
a second inverter cross coupled with the first inverter, wherein a first output of the comparator is coupled to an output of the second inverter and a second output of the comparator is coupled to an output of the first inverter;
a first drive transistor coupled to the first inverter, wherein a gate of the first drive transistor is coupled to the second node; and
a second drive transistor coupled to the second inverter, wherein a gate of the second drive transistor is coupled to the first node, wherein the input stage and the regeneration stage are arranged in parallel between a supply rail and a ground; and
an offset cancellation circuit, comprising:
a first offset transistor coupled to the second node, wherein a gate of the first offset transistor is configured to receive a first offset-cancellation voltage; and
a second offset transistor coupled to the first node, wherein a gate of the second offset transistor is configured to receive a second offset-cancellation voltage, and the offset cancellation circuit contributes to the cancellation of the offset voltage of the comparator; and
a latch having a first input and a second input, wherein the first input of the latch is coupled to the first output of the comparator, and the second input of the latch is coupled to the second output of the comparator.

29. The system of claim 28, wherein the input stage and the regeneration stage are arranged in parallel between a supply rail and a ground.

30. The system of claim 28, wherein the first input circuit comprises:
a first input transistor, wherein a source of the first input transistor is coupled to the first switching transistor, a gate of the first input transistor is coupled to the input of the comparator, and a drain of the first input transistor is coupled to the first node; and
a second input transistor, wherein a source of the second input transistor is coupled to the first switching transistor, a gate of the second input transistor is configured to receive the first compare voltage, and a drain of the second input transistor is coupled to the second node.

31. The system of claim 30, wherein the second input circuit comprises:
a third input transistor, wherein a source of the third input transistor is coupled to the second switching transistor, a gate of the third input transistor is coupled to the input of the comparator, and a drain of the third input transistor is coupled to the first node; and
a fourth input transistor, wherein a source of the fourth input transistor is coupled to the second switching transistor, a gate of the fourth input transistor is configured to receive the second compare voltage, and a drain of the fourth input transistor is coupled to the second node.

32. The system of claim 30, further comprising:
a transmitter having an output; and
a link coupled between the output of the transmitter and the input of the comparator.

33. The system of claim 28, wherein the latch comprises a set-reset (SR) latch.

34. The system of claim 28, further comprising a deserializer coupled to the latch.

* * * * *